(12) United States Patent
Garcia et al.

(10) Patent No.: US 10,209,314 B2
(45) Date of Patent: Feb. 19, 2019

(54) SYSTEMS AND METHODS FOR ESTIMATION AND PREDICTION OF BATTERY HEALTH AND PERFORMANCE

(71) Applicant: BATTELLE ENERGY ALLIANCE, LLC, Idaho Falls, ID (US)

(72) Inventors: Humberto E. Garcia, Idaho Falls, ID (US); Jon P. Christophersen, Moscow, ID (US)

(73) Assignee: Battelle Energy Alliance, LLC, Idaho Falls, ID (US)

(*) Notice: Subject to any disclaimer, the term of this patent is extended or adjusted under 35 U.S.C. 154(b) by 53 days.

(21) Appl. No.: 15/357,322

(22) Filed: Nov. 21, 2016

(65) Prior Publication Data

US 2018/0143257 A1    May 24, 2018

(51) Int. Cl.
*G01R 31/36* (2006.01)
*G05B 23/02* (2006.01)
(Continued)

(52) U.S. Cl.
CPC ..... *G01R 31/3651* (2013.01); *G01R 31/3606* (2013.01); *G01R 31/3679* (2013.01);
(Continued)

(58) Field of Classification Search
CPC ............ G01R 31/3606; G01R 31/3679; G01R 31/3651; G06N 3/04
See application file for complete search history.

(56) References Cited

U.S. PATENT DOCUMENTS

| 4,697,134 A | 9/1987 | Burkum et al. |
| 5,042,952 A | 8/1991 | Opsal et al. |

(Continued)

FOREIGN PATENT DOCUMENTS

| EP | 2840385 A1 | 2/2015 |
| WO | 2004106946 A2 | 12/2004 |

(Continued)

OTHER PUBLICATIONS

Christophersen et al., "Rapid Impedance Spectrum Measurements for State-of-Health Assessment of Energy Storage Devices", SAE 2012 World Congress & Exhibition, (Apr. 2012), 12 pages.

(Continued)

*Primary Examiner* — Bryan Bui
(74) *Attorney, Agent, or Firm* — TraskBritt

(57) ABSTRACT

Systems and computer-implemented methods are used for analyzing battery information. The battery information may be acquired from both passive data acquisition and active data acquisition. Active data may be used for feature extraction and parameter identification responsive to the input data relative to an electrical equivalent circuit model to develop geometric-based parameters and optimization-based parameters. These parameters can be combined with a decision fusion algorithm to develop internal battery parameters. Analysis processes including particle filter analysis, neural network analysis, and auto regressive moving average analysis can be used to analyze the internal battery parameters and develop battery health metrics. Additional decision fusion algorithms can be used to combine the internal battery parameters and the battery health metrics to develop state-of-health estimations, state-of-charge estimations, remaining-useful-life predictions, and end-of-life predictions for the battery.

20 Claims, 11 Drawing Sheets

(51) Int. Cl.
*G06N 99/00* (2010.01)
*G06N 3/04* (2006.01)
(52) U.S. Cl.
CPC ....... *G05B 23/0283* (2013.01); *G06N 99/005* (2013.01); *G06N 3/04* (2013.01)

(56) References Cited

U.S. PATENT DOCUMENTS

| | | | |
|---|---|---|---|
| 5,344,236 | A | 9/1994 | Fishman |
| 5,454,377 | A | 10/1995 | Dzwonczyk et al. |
| 6,054,868 | A | 4/2000 | Borden et al. |
| 6,072,299 | A | 6/2000 | Kurle et al. |
| 6,208,147 | B1 | 3/2001 | Yoon et al. |
| 6,519,539 | B1 | 2/2003 | Freeman et al. |
| 6,653,817 | B2 | 11/2003 | Tate, Jr. et al. |
| 6,691,095 | B2 | 2/2004 | Singh et al. |
| 6,778,913 | B2 | 8/2004 | Tinnemeyer |
| 6,816,797 | B2 | 11/2004 | Freeman et al. |
| 6,876,174 | B1 | 4/2005 | Samittier Marti et al. |
| 6,906,801 | B2 | 6/2005 | Borden et al. |
| 7,051,008 | B2 | 5/2006 | Singh et al. |
| 7,072,871 | B1 | 7/2006 | Tinnemeyer |
| 7,698,078 | B2 | 4/2010 | Kelty et al. |
| 7,898,263 | B2 | 3/2011 | Ishida et al. |
| 8,193,771 | B2 | 6/2012 | Coccio |
| 8,332,342 | B1* | 12/2012 | Saha ................ G01R 31/3679 706/45 |
| 8,368,357 | B2 | 2/2013 | Ghantous et al. |
| 8,415,926 | B2 | 4/2013 | Bhardwaj et al. |
| 8,598,849 | B2 | 12/2013 | Bhardwaj et al. |
| 8,831,897 | B2 | 9/2014 | McHardy |
| 8,868,363 | B2 | 10/2014 | Morrison et al. |
| 9,030,173 | B2 | 5/2015 | McHardy et al. |
| 9,207,285 | B1 | 12/2015 | Swanton et al. |
| 9,252,465 | B2 | 2/2016 | Hariharan |
| 9,465,077 | B2 | 10/2016 | Love et al. |
| 2003/0184307 | A1 | 10/2003 | Kozlowski et al. |
| 2006/0284617 | A1 | 12/2006 | Kozlowski et al. |
| 2007/0172708 | A1 | 7/2007 | Takebe et al. |
| 2009/0274191 | A1 | 11/2009 | Hache et al. |
| 2010/0201320 | A1 | 8/2010 | Coe et al. |
| 2013/0002267 | A1 | 1/2013 | Kothandaraman et al. |
| 2014/0172334 | A1* | 6/2014 | Cappuccino ....... G01R 31/3627 702/63 |
| 2015/0165921 | A1 | 6/2015 | Paryani |

FOREIGN PATENT DOCUMENTS

| | | |
|---|---|---|
| WO | 2015027210 A1 | 2/2015 |
| WO | 2016012922 A1 | 1/2016 |

OTHER PUBLICATIONS

Garcia et al., "On-line State-of-Health and Remaining-Useful-Life Assessment of Batteries using Rapid Impedance Spectrum Measurements", Idaho National Laboratory, 7.3, (Sep. 2013), pp. 115-118.
Goebel et al., "Prognostics in Battery Health Management", IEEE Instrumentation & Measurement Magazine 1094-6969/08, (Aug. 2008), pp. 33-40.
Kozlowski, James D., "Electrochemical Cell Prognostics using Online Impedance Measurements and Model-Based Data fusion Techniques", Applied Research Laboratory, vol. 7-3257, 14 pages.
Saha et al., "Prognostics Methods for Battery Health Monitoring Using a Bayesian Framework", IEEE Transactions on Instrumentation and Measurement, vol. 58, No. 2, (Feb. 2009), pp. 291-296.
Kozlowski, James D., "A Novel Online Measurement Technique for AC Impedance of Batteries and Other Electrochemical Systems", IEEE (2001) pp. 257-262.
Le et al., "Lithium-ion Battery State of Health Estimation Using Ah-V Characterization", Annual Conference of the Prognostics and Health Management Society, (2011) 7 pages.
Li et al., "Understanding the molecular mechanism of pulse current charging for stable lithium-metal batteries", Sci. Adv. 3, e1701246 (2017) 10 pages.
Lu et al., "A review on the key issues for lithium-ion battery management in electric vehicles", Journal of Power Sources 226 (2013) pp. 272-288.
Mingant et al., "Towards onboard Li-ion battery state-of-health diagnosis by a virtual sensor", World Electric Vehicle Journal, vol. 5 (2012) pp. 405-411, EVS26.
Morrison et al., "Fast Summation Transformation for Battery Impedance Identification," IEEE Aerospace 2009 Conference, Mar. 7-14, 2009, Big Sky, Montana, 9 pages.
Morrison et al., "Real Time Estimation of Battery Impedance," Proceedings from the IEEE Aerospace Conference, Mar. 5-11, 2006, Big Sky, MT, 13 pages.
Motloch et al., "High-Power Battery Testing Procedures and Analytical Methodologies for HEV's", 7, SAE Int. Passenger Cars Electron. Electr. Syst., vol. 111 (2002) pp. 797-802.
Noworolski et al., "Reducing and Utilizing Electrical Noises for Battery Monitoring Purposes", IEEE 32-4 (2004) pp. 611-614.
Okoshi et al., "Battery condition monitoring (BCM) technologies about lead-acid batteries", Journal of Power Sources 158 (2006) pp. 874-878.
Pastor-Fernandez et al., "A Study of Cell-to-Cell Interactions and Degradation in Parallel Strings: Implications for the Battery Management System", Journal of Power Sources 329 (2016) pp. 574-585.
Pastor-Fernandez et al., "A Comparison between EIS and IC-DV as Li-ion Diagnostic Techniques to Identify and Quantify the Effects of Degradation Modes within BMS", Journal of Power Sources 360 (2017) pp. 301-318.
Pop et al., "State-of-the-art of battery state-of-charge determination", Measurement Science and Technology, 16 (2005) R93-R110.
Qnovo "Fundamentals of Qnovo Adaptive Charging in Lithium Ion Batteries" http://qnovo.com/wp-content/uploads/2015/12/Qnovo_TechWhitePaper_v2.4_pdf, (2015) 13 pages.
Rahmoun et al., "Determination of the Impedance of Lithium-Ion Batteries using Methods of Digital Signal Processing", Energy Procedia 46 (2014) pp. 204 213.
Raijmakers et al., "Crosstalk Interferences on Impedance Measurements in Battery Packs", IFAC-PapersOnLine 49(11) (2016) pp. 042-047.
Saha et al., "Comparison of Prognostic Algorithms for Estimating Remaining Useful Life of Batteries", Transactions of the Institute of Measurement and Control, vol. 31, Issue 3-4 (2009) 10 pages.
Salehen et al., "Development of battery management systems (BMS) for electric vehicles (EVs) in Malaysia", MATEC Web of Conferences, 90, 01001 (2017), AiGEV 2016, 8 pages.
Sazhin et al., "Enhancing Li-Ion Battery Safety by Early Detection of Nascent Internal Shorts", Journal of the Electrochemical Society, 164 (1), (2017) pp. A6281-A6287.
Schweiger et al., "Comparison of Several Methods for Determining the Internal Resistance of Lithium Ion Cells", Sensors, 10, (2010) pp. 5604-5625.
Singh et al., "Fuzzy logic modeling of EIS measurements on lithium-ion batteries", Electrochimica Acta, 51 (2006) pp. 1673-1679.
Smyth, Brian, "Development of a Real Time Battery Impedance Measuring System," M.S. Thesis Montana Tech of be University of Montana, 2008, 128 pages.
Socher et al., "Improving the functional safety of automotive batteries using in-situ impedance spectroscopy", Transportation Research Procedia 14 ( 2016 ) pp. 3661-3666.
"1260 Impedance/Gain-Phase Analyzer", Operating Manual, Solartron Analytical (Jan. 1996) 215 pages.
"1287 Electrochemical Interface", User Guide, Solartron Analytical (2001) 134 pages.
Srivastav et al., "State-of-charge indication in Li-ion batteries by simulated impedance spectroscopy", J Appl Electrochem 47 (2017) pp. 22+ 236.
Sternad et al., "Condition monitoring of Lithium-Ion Batteries for electric and hybrid electric vehicles", Elektrotechnik & Informationstechnik, 126/5 (2009) pp. 186-193.

(56) References Cited

OTHER PUBLICATIONS

Stroe et al., "Diagnosis of Lithium-Ion Batteries State-of-Health based on Electrochemical Impedance Spectroscopy Technique", Proceedings of the 2014 Energy Conversion Congress and Exposition (ECCE) IEEE Press, pp. 1576-4582.
Taberna et al., "Electrochemical Characteristics and Impedance Spectroscopy Studies of Carbon-Carbon Supercapacitors", Journal of the Electrochemical Society, 150 (3), (2003) pp. A292-A300.
Tachibana et al., "Development of in situ a.c. impedance measurement system under constant-current conditions and its application to galvanostatic discharge of electrolytic manganese dioxide in alkaline solution" Journal of Power Sources 74 (1998) pp. 29-33.
Tang et al., "Temperature Dependent Performance and in Situ AC Impedance of High-Temperature PEM Fuel Cells Using the Nafion-112 Membrane", Journal of the Electrochemical Society, 153(11) (2006) pp. A2036-A2043.
Thomas et al., "Statistical methodology for predicting the life of lithium-ion cells via accelerated degradation testing", Journal of Power Sources, 184 (2008) pp. 312-317.
Unkelhaeuser et al., "Electrochemical Storage System Abuse Test Procedure Manual", United States Advanced Battery Consortium, SAND99-0497 (Jul. 1999) 28 pages.
Verbrugge, Mark, "Adaptive, multi-parameter battery state estimator with optimized time-weighting factors" J Appl Electrochem, vol. 37 (2007) pp. 605-616.
Verbrugge et al., "Adaptive state of charge algorithm for nickel metal hydride batteries including hysteresis phenomena" Journal of Power Sources, 126 (2004) pp. 236-249.
Waligo et al., "A Comparison of the Different Broadband Impedance Measurement Techniques for Lithium-Ion Batteries", Energy Conversion congress and Exposition (ECCE), IEEE (2016) 7 pages.
Weng et al., "On-board state of health monitoring of lithium-ion batteries using incremental capacity analysis with support vector regression", Journal of Power Sources 235 (2013) pp. 36-44.
Wu et al., "A Review on Fault Mechanisms and Diagnosis Approach for Li-Ion Batteries", Journal of Nanomaterials, Article ID 631263 (2015) 10 pages.
Xing et al., "Battery Management Systems in Electric and Hybrid Vehicles", Energies 2011, 4, pp. 1840-1857.
Xing et al., "Prognostics and Health Monitoring for Lithium-ion Battery", Proceedings of the IEEE International conference on Intelligence and Security Informatics, (2011) pp. 242-247.
Yamada et al., "The intelligent automotive battery, 'Cybox' ", Journal of Power Sources 185 (2008) pp. 1478-1483.
Yoo et al., "An Electrochemical Impedance Measurement Technique Employing Fourier Transform", Analytical chemistry, vol. 72, No. 9 (May 2000) pp. 2035-2041.
Zechang et al, "Battery Management Systems in the China-made 'Start' series FCHVs", IEEE Vehicle Power and Propulsion Conference (VPPC) (Sep. 2008) 6 pages.
Zhang et al., "Cycling degradation of an automotive LiFePO4 lithium-ion battery", Journal of Power Sources, 196 (2011) pp. 1513-1520.
Zhang et al., "Prediction of Lithium-Ion Batter|s Remaining Useful Life Based on Relevance Vector Machine", SAE Int. J. Alt. Power 5(1) (May 2016) pp. 30-40.
Zhu et al., "In-Situ Assessment of PEM Fuel Cells via AC Impedance at Operational Loads", http://folk.ntnu.noiskoge/prost/proceedings/aiche-2004/pdffiles/papers/014g.pdf (2004) 5 pages.
Zhu et al., "In-Situ Electrical Characterization of PEM Fuel Cells at Load", American Institute of Chemical Engineers (2007) 5 pages.
Zhu et al., "PSpice Simulation via AC Impedance for PEFC at Operational Loads", http://folk.ntnu.no/skoge/prost/proceedings/aiche-2005/topical/pdffilesfT1/papers/215c.pdf (2005) 3 pages.
Zou et al., "Combined State of Charge and State of Health estimation over lithium-ion battery cell cycle lifespan for electric vehicles", Journal of Power Sources 273 (2015) pp. 793-803.
Adany et al., "Switching algorithms for extending battery life in Electric Vehicles", Journal of Power Sources, 231 (2013) pp. 50-59.

Aglzim et al., "Characterization of the Resistance of a Fuel Cell on Load by Electrochemical Impedance Spectroscopy", Proceedings from the EUROCON Conference, IEEE (2007) pp. 1489-1492.
Albrecht, Weston, "Battery Complex Impedance Identification with Random Signal Techniques," May 4, 2005, Montana Tech of the University of Montana, 99 pages.
Ashtiani, Cyrus N., "Battery Hazard Modes and Risk Mitigation Analysis", USABC Version 0.0 (Aug. 2007) 10 pages.
Baert et al., "Determination of the State-of-Health of VRLA Batteries by Means of Noise Measurements", IEEE (downloaded Feb. 2010) pp. 301-306.
Banaei et al., "Online Detection of terminal voltage in Li-ion Batteries via Battery Impulse Response", IEEE (2009) pp. 194-198.
Barsukov et al., "Challenges and Solutions in Battery Fuel Gauging", www.ti.com/lit/ml/slyp086/slyp086.pdf, Power Management Workbook. Texas Instruments Inc., (2004), 10 pages.
"Battery Calendar Life Estimatory Manual, Modeling and Simulation", U.S. Department of Energy Vehicle Technologies Program, Revision 1, INL-EXT-08-15136, (Oct. 2012), 84 pages.
"Battery Test Manual for Plug-In Hybrid Electric Vehicles", U.S. Department of Energy Vehicle Technologies Program, INL/EXT-14-32849, Revision 3 (Sep. 2014) 82 pages.
"Battery Test Manual for 38 Volt Mild Hybrid Electric Vehicles", U.S. Department of Energy Vehicle Technologies Program, INL/EXT-15-36567, Revision 0 (Mar. 2017) 70 pages.
"Battery Test Manual for 12 Volt Start/Stop Vehicles", U.S. Department of Energy Vehicle Technologies Program, INL/EXT-12-26503, Revision 1 (May 2015) 67 pages.
"Battery Test Manual for Electric Vehicles", U.S. Department of Energy Vehicle Technologies Program, INL/EXT-15-34184, Revision 3 (Jun. 2015) 67 pages.
Blanke et al., "Impedance measurements on lead-acid batteries for state-of-charge, state-of-health and cranking capability prognosis in electric and hybrid electric venicles", Journal of Power Sources, 144 (2005) pp. 418-425.
Blidberg, Andreas, "Correlation between different impedance measurement methods for battery cells", KTH Chemical Science and Engineering (2012) 42 pages.
Bloom et al., "An Investigation of the Impedance Rise and Power Fade in High-Power Li-Ion Cells", presented at the 19th Inernational Electric Vehicle Symposium (EVS-19) (Oct. 2002) 14, pages.
Bohlen et al., "Impedance Based Battery Diagnosis for Automotive Applications", 35th Annual IEEE Power Electronics Specialists Conference (2004) pp. 2192-2797.
Bose et al., "Lessons Learned in Using OHMIC Techniques for Battery Monitoring", IEEE (2001) pp. 99-104.
Brauer et al., "Residential Energy Storage from Repurposed Electric Vehicle Batteries: Market Overview and Development of a Service-Centered Business Model", IEEE 18th Conference on Business Informatics, (2016) pp. 143-152.
Cabrera-Castillo et al, "Calculation of the state of safety (SOS) for lithium ion batteries", Journal of Power Sources 324 (2016) pp. 509-520.
Cheng et al., "Battery-Management System (BMS) and SOC Development for Electrical Vehicles", IEEE Transactions on Vehicular Technology, vol. 60, No. 1, (Jan. 2011) pp. 76-88.
Christensen et al., "Using on-board Electrochemical Impedance Spectroscopy in Battery Management Systems", World Electric Vehicle Journal, vol. 6—ISSN 2032-6653 (2013) pp. 0793-0799.
Christophersen et al., "Advanced Technology Development Program for Lithium-Ion Batteries: Gen 2 Performance Evaluation Final Report", FreedomCAR & Vehicle Technoliges Program, INL/EXT-05-00913 (Jul. 2006) 140 pages.
Christophersen et al., "Battery Technology Life Verification Testing and Analysis", Idaho National Laboratory INL/CON-07-12282 (Dec. 2007)12 pages.
Christophersen et al., "Effects of Reference Performance Testing during Aging Using Commercial Lithium-ion Cells," J. Electrochem Soc., 153(7) 2006, pp. A2406-A1416.
Christophersen et al., "Electrochemical Impedance Spectroscopy Testing on the Advanced Technology Development Program Lithium-ion Cells", 2002, IEEE Trans. Veh. Technol., pp. 1851-1855, 56(3).

(56) References Cited

OTHER PUBLICATIONS

Christophersen, Jon P., "Impedance Noise Identification for State-of-Health Prognostics," Jul. 7-10, 2008, Philadelphia, PA, 43rd Power Sources Conference, 4 pages.
Christophersen et al., "Performance Evaluation of Gen3 Advanced Technology Development Cells", 214th ECE Meeting, Abstract #549, The Electrochemical Society, (2008), 1 page.
Christophersen et al., "Pulse resistance effects due to charging or discharging of high-power lithium-ion cells: A path dependence study", Journal of Power Sources, 173 (2007) pp. 998-1005.
Cox et al., "Battery State of Health Monitoring, Combining Conductance Technology with Other Measurement Parameters for Real-Time Battery Performance Analysis", IEEE, 19-2 (2000) pp. 342-347.
Crow et al., "Integrated Prognostic Health Monitoring of Battery Health in Ground Robots", PennState Applied Research Laboratory, 32nd Association for Unmanned Vehicle Systems International Meeting (Jun. 2005) 16 pages.
Delaille et al., "Study of the 'coup de fouet' of lead-acid cells as a function of their state-of-charge and state-of-health", Journal of Power Sources, 158 (2006) pp. 1019-1028.
Diard et al., "Constant load vs constant current EIS study of electrochemical battery discharge", Electrochimica Acta, vol. 42, Nos. 23-24 (1997) pp. 3417-3420.
Diard et al., "EIS study of electrochemical battery discharge on constant load", Journal of Power Sources, 70 (1998) pp. 78-84.
Diard et al., "Impedance measurements of polymer electrolyte membrane fuel cells running on constant load", Journal of Power Sources, 74 (1998) pp. 244-245.
Donnellan et al., "Impedance Noise Identification", (May 2008) 72 pages.
Doughty et al., "Electrical Energy Storage System Abuse Test Manual for Electric and Hybrid Electric Vehicle Applications", FreedomCAR, SAND2005-3123 (Jun. 2005) 46 pages.
Farmann et al., "Critical review of on-board capacity estimation techniques for lithium-ion batteries in electric and hybrid electric vehicles", Journal of Power Sources 281 (2015) pp. 114-130.

"FreedomCAR Ultracapacitor Test Manual", Idaho National Laboratory, DOE/ID-11173, Revision 0 (Sep. 2004) 116 pages.
Gould et al., "New Battery Model and State-of-Health Determination Through Subspace Parameter Estimation and State-Observer Techniques", IEEE Transactions on Vehicular Technology, vol. 58, No. 8 (Oct. 2009) pp. 3905-3916.
Guha et al., "Remaining Useful Life Estimation of Lithium-Ion Batteries based on the Internal Resistance Growth Model" Indian Control Conference (ICC), (2017) pp. 33-38.
Hariprakash et al, "Monitoring sealed automotive lead-acid batteries by sparse-impedance spectroscopy", Proc. Indian Acad. Sci. (Chem. Sci.), vol. 115, Nos. 5&6 (Oct.-Dec. 2003) pp. 465-472.
Hariprakash et al., "On-line monitoring of lead-acid batteries by galvanostatic non-destructive technique", Journal of Power Sources 137 (2004) pp. 128-133.
Haskins et al., "Battery Technology Life Verification Test Manual", Idaho National Laboratory, INEEL/EXT-04-01986 (Feb. 2005) 133 pages.
Hlavac et al., "VRLA Battery Monitoring Using Conductance Technology", IEEE, 12-3 (1995) pp. 284-291.
Hoffmann et al. "Development and Test of a Real Time Battery Impedance Estimation System", IEEE Aerospace 2006 Conference, Mar. 5-11, 2006, Big Sky Montana, 8 pages.
Howey et al., "On-line measurement of battery impedance using motor controller excitation", IEEE Transactions on Vehicular Technology, vol. 63, Issue 6, (Jul. 2014) pp. 2557-2566.
Huang et al., "An Online Battery Impedance Measurement Method Using DC-DC Power Converter Control", IEEE Transactions on Inductrial Electronics, vol. 61, No. 11 (Nov. 2014) pp. 5987-5995.
Karden et al., "A method for measurement of interpretation of impedance spectra for industrial batteries", Journal of Power Sources, 85 (2000) pp. 72-78.
Kiel et al., "Validation of single frequency Z measurement for standby battery state of health determination", IEEE, 2-3 (2008) 7 pages.

\* cited by examiner

SYSTEMS AND METHODS FOR ESTIMATION AND PREDICTION OF BATTERY HEALTH AND PERFORMANCE

GOVERNMENT RIGHTS

This invention was made with government support under Contract Number DE-AC07-05ID14517 awarded by the United States Department of Energy. The government has certain rights in the invention.

FIELD

Embodiments of this disclosure relate to apparatus and methods for estimating and predicting health and performance conditions of electro-chemical cells, batteries, and battery systems.

BACKGROUND

Batteries (also referred to herein as electrochemical cells) typically include a number of electrochemical cells arranged in a specific manner to provide electrical energy to a connected energy resource (i.e., a load) during discharge and accept electrical energy during charging from an energy source. Three main components can be identified within a battery, namely, a negative electrode, a positive electrode, and an electrolyte. An electrochemical cell stores electrochemical energy in active materials bonded to its positive and negative electrodes. A battery's functionality can be described by the primary and secondary reactions that occur within the battery's electrochemical cells. In particular, when a conductive external circuit is connected to the electrodes, electrons are transferred from one active material to the other as their chemical compositions change. The electrolyte also participates in the reaction by exchanging ions between active materials.

Several processes occur during charge and discharge reactions including chemical, electrochemical, and diffusion processes. The reactions and reactants that are present at each active mass surface as well as the morphological structure and availability of active materials determine the battery's electrical behavior and performance under different operating conditions. The active material structure and its associated conductivity, which are affected by the given operating conditions, can thus have an impact on battery parameters like capacity and internal resistance. For example, higher temperatures may lead to increased ion energy and mobility, allowing a greater surface area to participate in reactions, thus lowering the battery's internal resistance, but also reducing overall life expectancy.

There is a need for new and more accurate ways to estimate and predict battery health and battery performance in order to provide a user, or other systems, with information on the present state and possible future states of a battery.

BRIEF SUMMARY

Embodiments of the present disclosure include a computer-implemented method for analyzing energy storage device information. The method includes a feature extraction module configured for receiving input data including passive information collected from passive measurements of a battery and active information collected from active measurements of a response of the battery to a stimulus signal applied to the battery. The feature extraction module is also configured for performing geometric-based parameter identification responsive to the input data relative to an electrical equivalent circuit model to develop geometric parameters and performing optimization-based parameter identification responsive to the input data relative to the electrical equivalent circuit model to develop optimized parameters. The feature extraction module is also configured for performing a decision fusion algorithm for combining the geometric parameters and the optimized parameters to develop new internal battery parameters including at least a constant phase element exponent, electrolyte resistance, and charge transfer resistance. The method also includes a state estimation module for updating an internal state model of the battery responsive to the new internal battery parameters, a health estimation module for processing the internal state model to determine a present battery health including one or both of a state-of-health (SOH) estimation and a state-of-charge (SOC) estimation for the battery, and a communication module for communicating one or more of the SOH estimation and the SOC estimation to a user, a related computing system, or a combination thereof.

Embodiments of the present disclosure also include another computer-implemented method for analyzing battery information. The method includes receiving input data including passive information collected from passive measurements of a battery and active information collected from active measurements of a response of the battery to a stimulus signal applied to the battery. The method also includes performing a feature extraction process using the input data to develop internal battery parameters including at least a constant phase element exponent, electrolyte resistance, and charge transfer resistance. The method also includes performing two or more analysis processes using the internal battery parameters to develop two or more health metrics corresponding to each analysis process, wherein the health metrics from the analysis processes are selected from capacity, available power, or pulse resistance. The method also includes determining a state-of-health (SOH) estimation for the battery by performing a decision fusion algorithm for combining the two or more health metrics from the two or more analysis processes and communicating the SOH estimation to a user, a related computing system, or a combination thereof.

Embodiments of the present disclosure further include another computer-implemented method for analyzing battery information. The method includes receiving input data including passive information collected from passive measurements of a battery and active information collected from active measurements of a response of the battery to a stimulus signal applied to the battery. The method also includes performing a feature extraction process using the input data to develop internal battery parameters including at least a constant phase element exponent, electrolyte resistance, and charge transfer resistance. The method also includes performing two or more analysis processes using the internal battery parameters to develop two or more state-of-charge (SOC) estimates corresponding to each analysis process, wherein the analysis processes are selected from a neural network (NN) analysis, an auto regressive moving average (ARMA) analysis, and a combination of a second neural network analysis with a particle filter analysis. The method further includes determining an SOC estimation for the battery by performing a decision fusion algorithm for combining the two or more SOC estimates from the two or more analysis processes and communicating the SOC estimation to a user, a related computing system, or a combination thereof.

Embodiments of the present disclosure further include another computer-implemented method for analyzing battery information. The method includes receiving input data including passive information collected from passive measurements of a battery and active information collected from active measurements of a response of the battery to a stimulus signal applied to the battery. The method also includes performing a feature extraction process using the input data to develop internal battery parameters including at least a constant phase element exponent, electrolyte resistance, and charge transfer resistance. The method also includes performing two or more analysis processes using the internal battery parameters to develop two or more remaining-useful-life (RUL) estimates corresponding to each analysis process and two or more end-of-life (EOL) estimates corresponding to each analysis process, wherein the analysis processes are selected from a particle filter (PF) analysis, a neural network (NN) analysis, and an auto regressive moving average (ARMA) analysis. The method also includes determining an RUL prediction for the battery by performing a decision fusion algorithm to combine the two or more RUL estimates from the two or more analysis processes, determining an EOL prediction for the battery by performing the decision fusion algorithm to combine the two or more EOL estimates from the two or more analysis processes, and communicating at least one of the RUL estimation and the EOL estimation to a user, a related computing system, or a combination thereof.

Embodiments of the present disclosure further include a battery condition monitoring system. The battery condition monitoring system includes one or more active data acquisition units configured for applying a signal to a battery and measuring a response of the battery to the applied signal as active information and processing circuitry. The processing circuitry is configured for performing geometric-based parameter identification responsive to the active information relative to an electrical equivalent circuit model to develop geometric parameters and performing optimization-based parameter identification responsive to the active information relative to the electrical equivalent circuit model to develop optimized parameters. The processing circuitry is further configured for performing a decision fusion algorithm for combining the geometric parameters and the optimized parameters to develop new internal battery parameters including at least a constant phase element exponent, electrolyte resistance, and charge transfer resistance. The processing circuitry is further configured for updating an internal state model of the battery responsive to the new internal battery parameters, processing the internal state model to determine a battery health prediction including one or both of a remaining-useful-life (RUL) prediction and an end-of-life (EOL) prediction for the battery, and communicating one or more of the RUL prediction, the EOL prediction, to a user, a related computing system, or a combination thereof.

DETAILED DESCRIPTION

Figure 1:
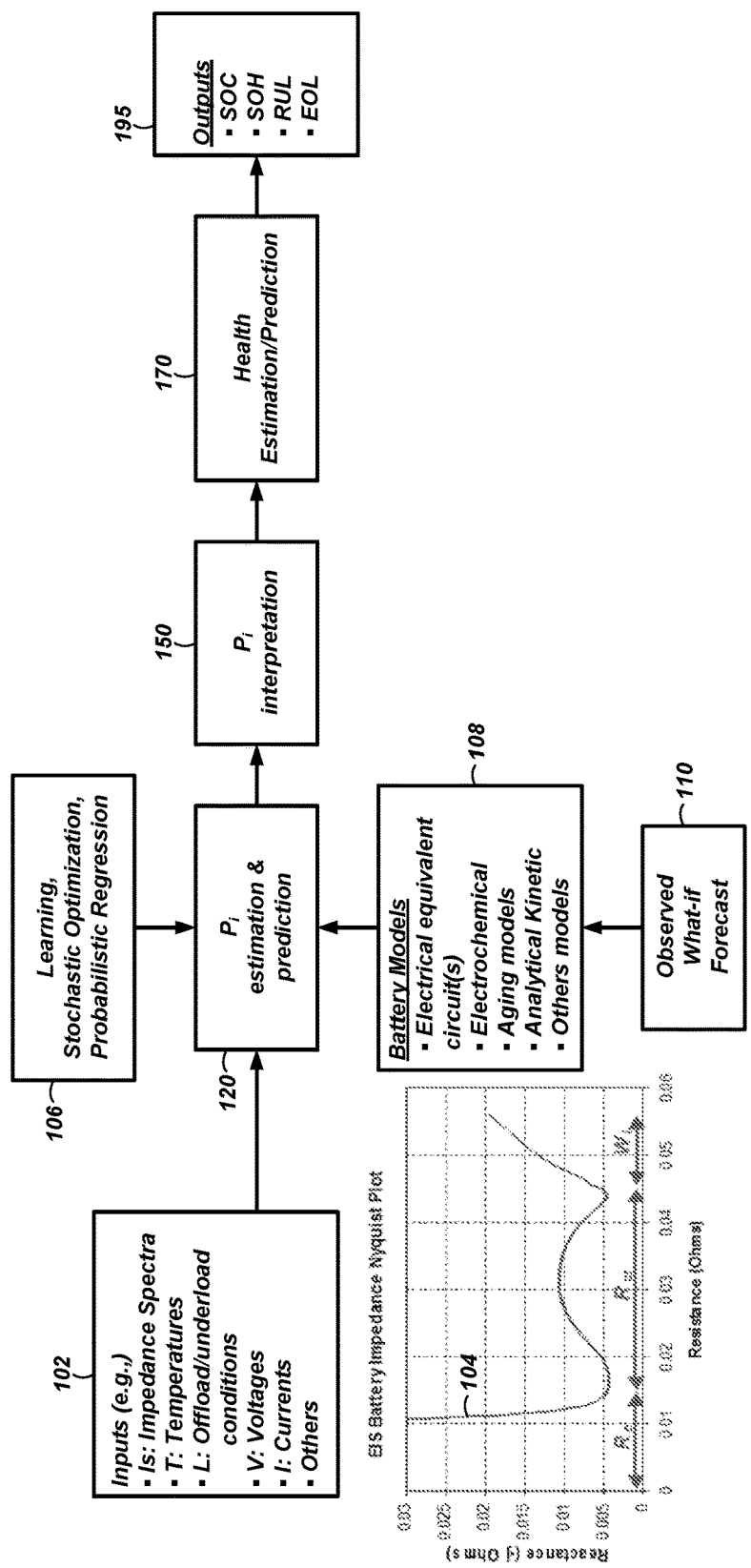
FIG. 1 is a top-level block diagram showing processes for an online Battery Condition Monitoring (BCM) system according to an embodiment of the present disclosure.

In the following detailed description, reference is made to the accompanying drawings, which form a part hereof, and in which are shown, by way of illustration, specific example embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure. The illustrations presented herein are not meant to be actual views of any particular method, system, device, or structure, but are merely idealized representations that are employed to describe the embodiments of the present disclosure. Similar structures or components in the various drawings may retain the same or similar numbering for the convenience of the reader; however, the similarity in numbering does not mean that the structures or components are necessarily identical in size, composition, configuration, or any other property.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, symbols, and chips that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

Also, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1). For ease of following the description, for the most part element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Reference throughout this specification to "one embodiment," "an embodiment," or similar language means that a particular feature, structure, or characteristic described in connection with the indicated embodiment is included in at least one embodiment of the present disclosure. Thus, the phrases "in one embodiment," "in an embodiment," and similar language throughout this specification may, but do not necessarily, all refer to the same embodiment.

Before describing specific embodiments, and in order to facilitate description in the present disclosure, various terms are described herein. Where ambiguity may exist between the plain meaning, dictionary meaning, and the term as described herein, a person of ordinary skill in the art will recognize the term as described herein will best conform to a more comprehensive understanding of embodiments of the present disclosure.

The terms "battery," "energy storage devices," and "electrochemical cell," and their plurals, may be used interchangeably in this descriptions to refer to one or more electrochemical cells and other energy storage devices arranged in a specific manner to provide electrical energy to a connected energy resource (i.e., a load) during discharge and accept and store electrical energy during charging from an energy source.

An "algorithm" means a software process performed by a special-purpose computer configured to perform specific acts for processing input information and generate output information used in embodiments of the present disclosure. Unless specified otherwise, algorithms described herein are of a complexity that makes performing the acts of the algorithm too difficult or too slow to be useful when performed without the aid of the software processes. A general-purpose computer when configured to include software processes of the present disclosure is considered a special-purpose computer configured to perform specific acts of the present disclosure.

A "module" means a software process, a collection of software processes, a collection of hardware elements, or a combination thereof configured to implement one or more elements of the present disclosure.

The term "online" is used to refer to a monitoring system while it is coupled to a battery such that the monitoring system can collect data about the energy storage device while in charging, discharging, and quiescent conditions.

Batteries, and other energy storage devices, are used in many personal, commercial, and military applications. These devices are available in various sizes and chemistries including, for example, Zinc-Carbon, Alkaline, Lead Acid, Nickel Cadmium, Nickel-Zinc, Nickel Metal Hydride, and Lithium-Ion and must perform in normal as well as severe environments. Typical applications include computers, medical, communication devices (e.g., mobile phones and cell towers), data centers, aircrafts, hybrid, plug-in hybrid electric vehicles (PHEV), and electric vehicles. High cost and long-life requirements for several applications drive the need for a quick, accurate, and robust health management system. In order to meet stringent user requirements and efficiently integrate batteries within tightly-coupled energy systems, it is useful to accurately assess online several metrics characterizing their internal condition including state-of-charge (SOC), state-of-health (SOH), remaining-useful-life (RUL), and end-of-life (EOL).

Embodiments of the present disclosure provide architectures and methodologies for using passive and active measurements collected from a set of distributed sensors in order to estimate and predict the health and performance of electrochemical cells, batteries, and battery systems.

More particularly, embodiments of the present disclosure include a battery diagnostic and prognostic architecture using methods, algorithms, and models, wherein the internal conditions of the battery can be estimated and predicted.

One type of data collected from measurements of a battery under examination are electrical impedance spectra. As a result, this disclosure is particularly tailored for battery systems where changes in their internal conditions, including health and performance, can be correlated with changes in their electrical internal impedance.

Historic sets of data or distinct sets of data generated at different operational conditions of interest may be collected offline in the present disclosure by various battery testing procedures (e.g., electrochemical impedance spectroscopy, EIS) and battery features (e.g., electrolyte and charge transfer resistances) are then extracted. This information is then used by the present disclosure to construct an aging model or a multiplicity of aging models considering different failure mechanisms of the battery through learning algorithms (e.g., relevance vector machines (RVM), fuzzy logic, and neural networks). These aging models will age the battery in distinct manners and at different rates. For monitoring, the aging model corresponding to the considered condition at hand is used to implement algorithms (e.g., particle filtering) that estimate battery SOH and RUL as battery data and features are respectively collected and extracted periodically during offline testing.

Many existing techniques estimate battery metrics based on passive observations. Consequently, the assessment of battery conditions is indirectly computed, without actively probing the battery under examination in order to directly assess its actual conditions. When relying on passive observations, it is often useful to accurately collect information on past operations and to heavily rely on models and databases (resulting from extensive offline testing) towards maintaining knowledge regarding battery conditions.

When using active observations (e.g., Electrochemical Impedance Spectroscopy, EIS, and offline pulsing), many existing techniques can only be used to estimate battery metrics when the battery is offline. Consequently, they usually are unsuitable for use in battery OCM onboard modules. In many cases, active observations must be benign and not be a source of degradation for the energy storage system.

Embodiments of the present disclosure describe architectures, methods, and algorithms for assessing the internal condition of batteries by transforming collected measurements (such as impedance spectra) into information (such as battery internal resistances) and then into knowledge in the form of estimated and predicted indicators and metrics associated with the internal condition of the battery system under observation and management. In many cases, active observations are used, which may be configured to be substantially benign and not be a source of degradation for the energy storage system.

Embodiments of the present disclosure can adapt to how impedance measurements are collected online while the battery system under observation may be in operation. Several techniques may be used to this end. As one particular example, a Harmonic Compensated Synchronous Detection (HCSD) may be used to provide the opportunity to rapidly acquire impedance spectrum measurements for online applications. HCSD is described in U.S. Pat. No. 8,868,363, entitled "Method of Estimating Pulse Response Using an Impedance Spectrum," the contents of which are hereby incorporated in its entirety.

The capabilities introduced by the present disclosure include feature extraction algorithms to extract internal battery parameters in accordance with the particular models used to characterize the monitored battery. These feature extraction modules act as analytical sensors transforming data (e.g., impedance spectra) into information (e.g., internal battery parameters) related to battery conditions.

These estimated parameters are provided as input data for a state estimation algorithm, which computes the internal state of the battery. The state variables of the battery are accordingly defined as state estimation data based on the battery model used by the feature extraction step.

In order to ensure improved robustness and accuracy, a plurality of algorithms uses this computed state vector data to estimate performance metrics such as, for example, SOC, capacity, pulse resistance, and available power.

Mapping algorithms used in the present disclosure to convert the state estimation data into the performance metrics include polynomial fitting, neural network models, and Auto Regressive Moving Average (ARMA).

A decision fusion algorithm is then used to combine the estimations computed for each performance metric. While the estimated value for SOC is ready for communication to the user or other analysis systems, another decision fusion algorithm is then used to combine the estimated values for other performance metrics such as capacity, pulse resistance, and available power for computing SOH.

The estimated value of SOH is now ready for communication to the user or other analysis systems. In computing these health and performance metrics, other passive measurements, such as temperature, and system information are used to compensate estimations using (historical) models acquired at different operating conditions than those present when these calculations take place.

The training of these mapping models and algorithms is achieved by using measurements and characterizations specifically collected for training at different operating conditions, including diverse temperature and charge/discharge profiles. This training data can be collected for different options of battery chemistries, capacities, configurations, and other possibilities. As the above description mainly pertains to the task of "estimating" battery condition metrics, a similar information flow is applied when "predicting" battery condition metrics such as RUL and EOL. However, an additional set of models are used with prediction to forecast what may be the battery conditions under assumed future operating conditions at diverse time horizons.

Embodiments of the present disclosure may be used within an online Battery Condition Monitoring (BCM) system that tracks changes in battery performance in order to estimate and predict battery condition metrics (e.g., SOC/SOH/RUL/EOL) and to optimally manage power based on user requirements, system usage models, and environmental conditions. Inputs to the BCM system may include user requirements (e.g., user behavior, survivability needs), environmental conditions (e.g., current and anticipated power demand, limitations, uncertainties), performance data, and sensor data (e.g., passive and active measurements). To process these inputs, the BCM system may utilize several data processing modules including power assessment and management, as well as local and global health monitoring and assessment modules.

After processing, the BCM system may then output control commands to power sources (e.g., batteries) and loads (e.g., computers, electronics, motors, and actuators). An integrated energy storage monitoring and control system may holistically combine sensing, modeling, design, and controls for improved energy health assessment and management. These modules can be accordingly optimized to best meet both observability and controllability requirements of the overall battery system. Battery online condition monitoring (OCM) using rapid impedance measurements may provide advantages, such as improving safety with more rapid identification of battery incipient failures, improving cost with more efficient battery replacement schedules, and improving SOH assessments with a more complete picture of battery conditions.

Several terms associated with battery operation are briefly addressed next for completeness and ease of following explanations regarding the present disclosure. In particular, three terms are briefly defined, namely, capacity, SOC, SOH.

Capacity refers to the total amount of charge that can be drawn from a fully charged battery until it is depleted. The rated capacity of a battery is typically given in units of amp-hours (Ah) for a specified temperature and discharge current. However, the actual effective capacity is dependent on the actual conditions in which the battery is discharged.

SOC denotes the amount a battery has been discharged with respect to its nominal capacity. Therefore, a fully charged and discharged battery would have an SOC of 100% and 0%, respectively. Tracking the SOC of a battery is useful as SOC affects a battery's dynamic characteristics and longevity.

There is no widely accepted definition for SOH, nor adopted standards for assessing battery SOH, and its interpretation is largely application-dependent. SOH may be defined in terms of different battery characteristics. For example, capacity is often the primary health metric of interest for defining SOH in stationary applications and vehicle applications. On the other hand, available power or peak power out are the corresponding health metrics of importance in starter battery applications. Internal resistance or pulse resistance may also be used to define SOH. The present disclosure in various embodiments computes all these health metrics and combines two or more of them using a decision fusion algorithm to produce a more robust and comprehensive assessment of battery conditions. It is useful to track SOH because of the gradual loss in electrical performance after the battery undergoes a number of chemical reactions and aging mechanisms from its usage and storage. As mentioned, this aging manifests itself in the increase of the internal resistance and decrease of the capacity of the battery under examination.

FIG. 1 is a top-level block diagram showing processes for an online Battery Condition Monitoring (BCM) system according to an embodiment of the present disclosure. This diagram illustrates a top-level view of processing operations and features of the present disclosure. Additional details for some of the modules are shown and discussed with reference to FIGS. 2-9.

Three primary operations, generally executed in sequence, are: 1) state estimation and prediction 120 of internal battery parameters based on observations and embedded knowledge, 2) state interpretation 150 of these calculated parameters, and 3) computation of health estimation and prediction 170.

In particular, the BCM system receives input data 102 (e.g., measurement signals) and computes output data 195 for further consumption by human users, other computer systems, other electronic systems, other electromechanical systems, or combinations thereof.

As non-limiting examples, input data 102 include impedance spectra, temperatures, offload/underload conditions, voltages, and currents collected at sampling rates that are accordingly selected for the applications at hand.

Also as non-limiting examples, output data 195 include SOC, SOH, RUL, and EOL. As value examples: SOC may be presented as a number estimated between 0 and 100% indicating how much charge is available, SOH may be presented as a number estimate between 0 and 1 with 0 indicating a failed battery and 1 indicating a healthy battery, RUL may be presented in a number of hours or minutes prediction until the battery is no longer useful, and EOL may be presented as a time value prediction indicating a time until the battery is no longer useful.

The BCM system may utilize one or more training/learning processes 106 including embedded learning, stochastic optimization, and probabilistic regression methods and algorithms to estimate and predict current and future values of internal parameters $p_i$ of the battery under observation, as described more fully below.

The internal parameters $p_i$ are computed assuming observed, what-if, and forecast conditions defined in module 110 and learned battery models 108 including electrical equivalent circuits, electrochemical aging models, analytical/kinetic models, as well as other battery models.

Non-limiting examples of computed internal parameters include electrolyte resistance ($R_e$), charge transfer resistance, ($R_{ct}$), constant-phase-element (CPE) exponents (u), and true capacity ($C_{max}$). FIG. 1 also illustrates a Nyquist plot 104 derived from EIS analysis. Additional details for the Nyquist plot 104 and how it is used to derive battery models 108 and other internal parameters are discussed below in combination with FIG. 5 and a specific electrical equivalent circuit model.

A state estimation and prediction module 120 uses the input data 102, information from the observed, what-if, and forecast module 110, the battery models 108, and the training/learning processes 106 to update and propagate the internal parameters $p_i$ to other analysis modules.

A state interpretation module 150 then interprets the computed values of internal parameters $p_i$ into indicators and metrics associated with performance and health conditions related to the battery such as capacity, available power, and pulse resistance.

With these indicator and metric interpretations, a health estimation and prediction module 170 includes algorithms to compute the output data 195 for the BCM system.

Some elements employed by the present disclosure are embedded computational models and methods (e.g., algorithms), while some elements of the present disclosure are not only the estimation, but also the prediction, of battery parameters and metrics. The observed, what-if, and forecast module 110 may include databases of historically observed operation as well as forecast predictions and what-if assumptions to construct, refine, or a combination thereof, various models (e.g., aging models) and to support estimations of battery future conditions.

Figure 2:
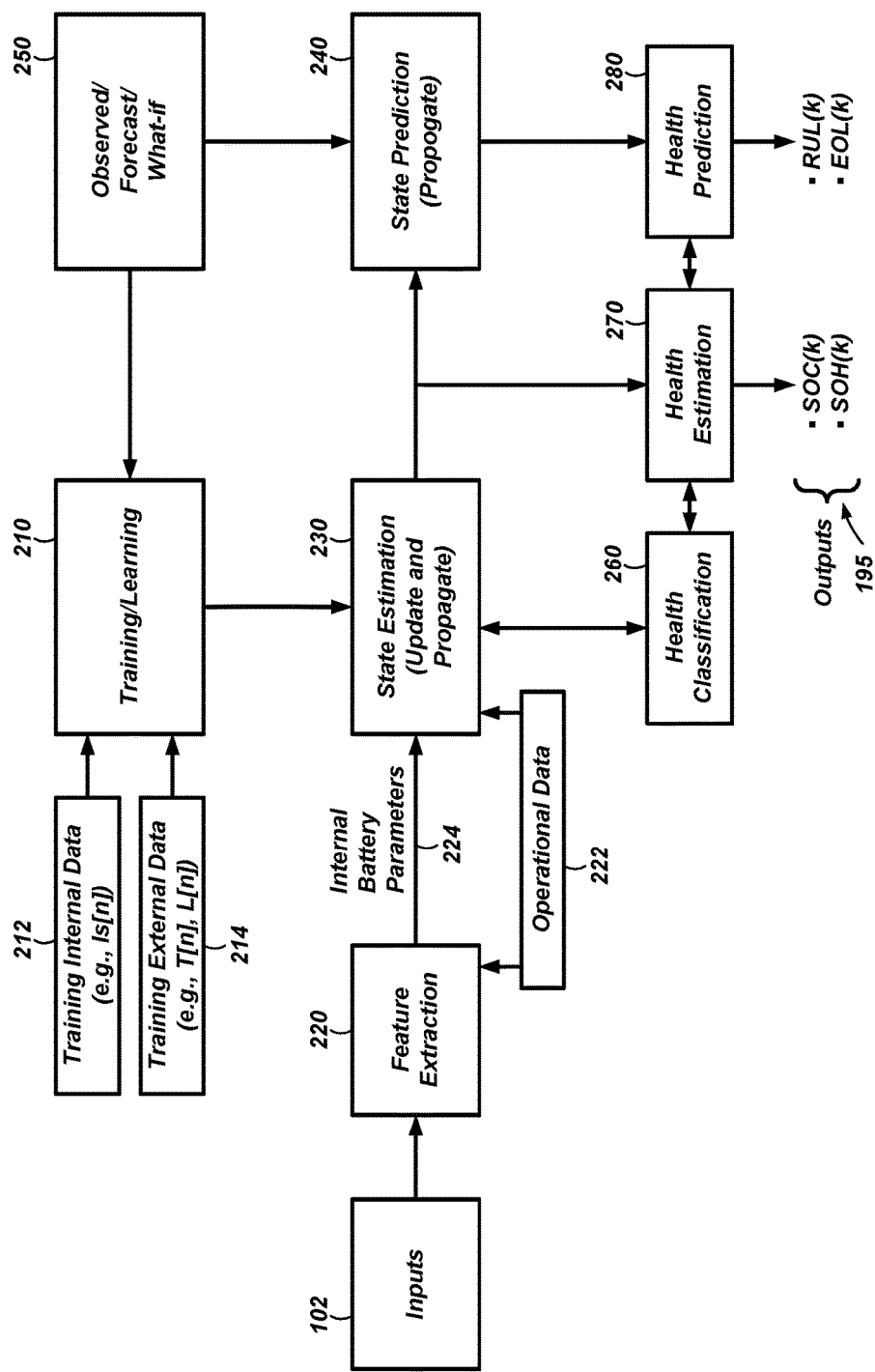
FIG. 2 is a block diagram showing processes in an online BCM system supported by training, learning, feature extraction, state update, and state propagation methods.

FIG. 2 is a block diagram showing processes in an online BCM system supported by training, learning, feature extraction, state update, and state propagation methods. This diagram illustrates basic modules of the present disclosure. Four main modules are: 1) a training and learning module 210 used for tuning embedded models based on training data; 2) a feature extraction module 220 used for computing internal battery parameters; 3) a state estimation module 230 used for estimating the current condition state of the battery based on current and historical information, which is then used to estimate current battery health conditions (e.g., SOC, SOH); and 4) a state prediction module 240 used for predicting the future condition state of the battery based on forecasted or assumed future operational conditions of interest for what-if analysis, which is then used to predict future battery health conditions (e.g., RUL, EOL).

FIG. 2 augments the description of the present disclosure as shown in FIG. 1 in that it introduces the training inputs (212, 214) and roles of the training and learning module 210 (and associated characterization campaigns and learned/trained data-driven models) as well as of the feature extraction module 220, in addition to explicitly separating the computational tasks of the state estimation module 230 and the state prediction module 240 from the health estimation and prediction module 170 of FIG. 1.

In order to properly function, the online BCM system embeds and utilizes data-driven models for translating extracted internal battery parameters and health indicators (e.g., electrolyte and charge transfer resistances) into health-related metrics (e.g., capacity, available power, and pulse resistance) and also for predicting how these parameters and metrics may change with time under observed or assumed operating conditions.

These data-driven models, corresponding to input/output characterizations of the particular battery systems of interest, are computed or tuned based on observations collected during experimental testing, in-field operations, or combinations thereof. To accomplish the tuning, the training and learning module 210 may use inputs from existing internal state data 212 as well as current and historical external data 214, such as, for example, temperature and load conditions. The training and learning module 210 thus constructs models (e.g., aging models) that best fit estimations with the training data. With these mappings tuned and embedded within it, the BCM system is ready for operation.

Specifically, measurements, as input data 102, are periodically collected and sent, along with other operational data 222, to the feature extraction module 220 where internal battery parameters 224 are computed. Additional details of the feature extraction module 220 are discussed below with reference to FIG. 4.

Given these internal battery parameters 224, as well as the operational data 222, the state estimation module 230 estimates the current condition state of the battery, which is then used by a health estimation module 270 embedding learned and trained models to compute current health metrics as output data 195, namely, SOC and SOH. Additional details on development of the SOH output data 195 are discussed below with reference to FIG. 6. Additional details on development of the SOC output data 195 are discussed below with reference to FIG. 7.

Given the estimated current condition state of the battery, the state prediction module 240, determines a future condition state of the battery, which is predicted assuming historically observed, forecasted, or formulated operational conditions conceived for what-if analysis from an observed, forecast, what-if module 250. Further details on the observed, forecast, what-if module 250 are provided below with reference to FIG. 8.

The predicted future condition state of the battery is then used by a health prediction module 280 embedding learned/trained models to compute future health metrics as output data 195, namely, RUL and EOL. Additional details on development of the RUL and EOL output data 195 are discussed below with reference to FIGS. 8 and 9.

A health classification module 260 may be used to track various battery characteristics derived from information from the state estimation module 230 and health estimation module 270. These battery characteristics may then be used by the health estimation module 270 along with the estimated current condition state of the battery in developing the SOC and SOH output data 195.

Figure 3:
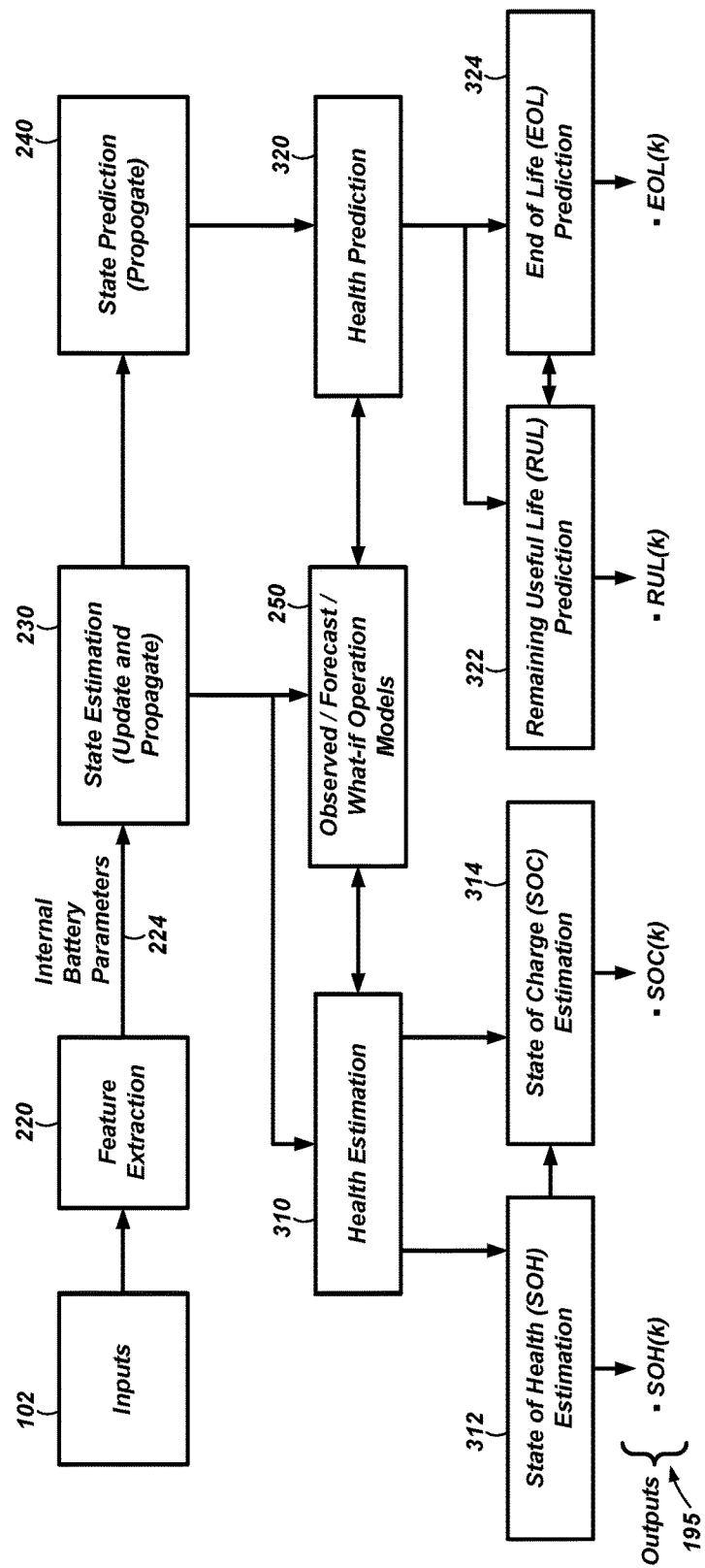
FIG. 3 is a block diagram showing process details of an online battery health estimation and health prediction system.

FIG. 3 is a block diagram showing process details of an online battery health estimation and health prediction system. FIG. 3 augments the description of the present disclosure as schematized in FIGS. 2 and 1 in that it further separates the tasks of estimation and prediction as well as introduces four distinct computational paths for computing each of the four identified elements of output data 195. Thus, the elements of input data 102, the feature extraction module 220, the internal battery parameters 224, the state estimation module 230, the state prediction module 240, the observed, forecast, what-if module 250, and the output data 195 are the same as described above.

FIG. 3 illustrates further details including specific modules for health estimation and prediction of battery conditions. In particular, in FIG. 3 the health estimation module 270 of FIG. 2 is separated into a health estimation module 310 and two different modules to conduct estimation calculations, namely, an SOH estimation module 312 and an SOC estimation module 314. Similarly, in FIG. 3 the health prediction module 280 of FIG. 2 is separated into a health prediction module 320 and two different modules to conduct prediction calculations, namely, an RUL prediction module 322 and an EOL prediction module 324.

In addition to clearly demarking the tasks of estimation and prediction, this figure also indicates by a unidirectional arrow that SOH calculations computed by the SOH estimation module 312 are utilized by the SOC estimation module 314 for computing SOC of the battery under monitoring. Furthermore, this figure indicates by a bidirectional arrow that RUL and EOL calculations computed by the RUL estimation module 322 and EOL estimation module 324 respectively are related to each other. Thus, four distinct processing paths are here schematized, with each utilizing a plurality of methods, algorithms, and models as addressed in the following descriptions for FIGS. 6, 7, 8, and 9.

Figure 4:
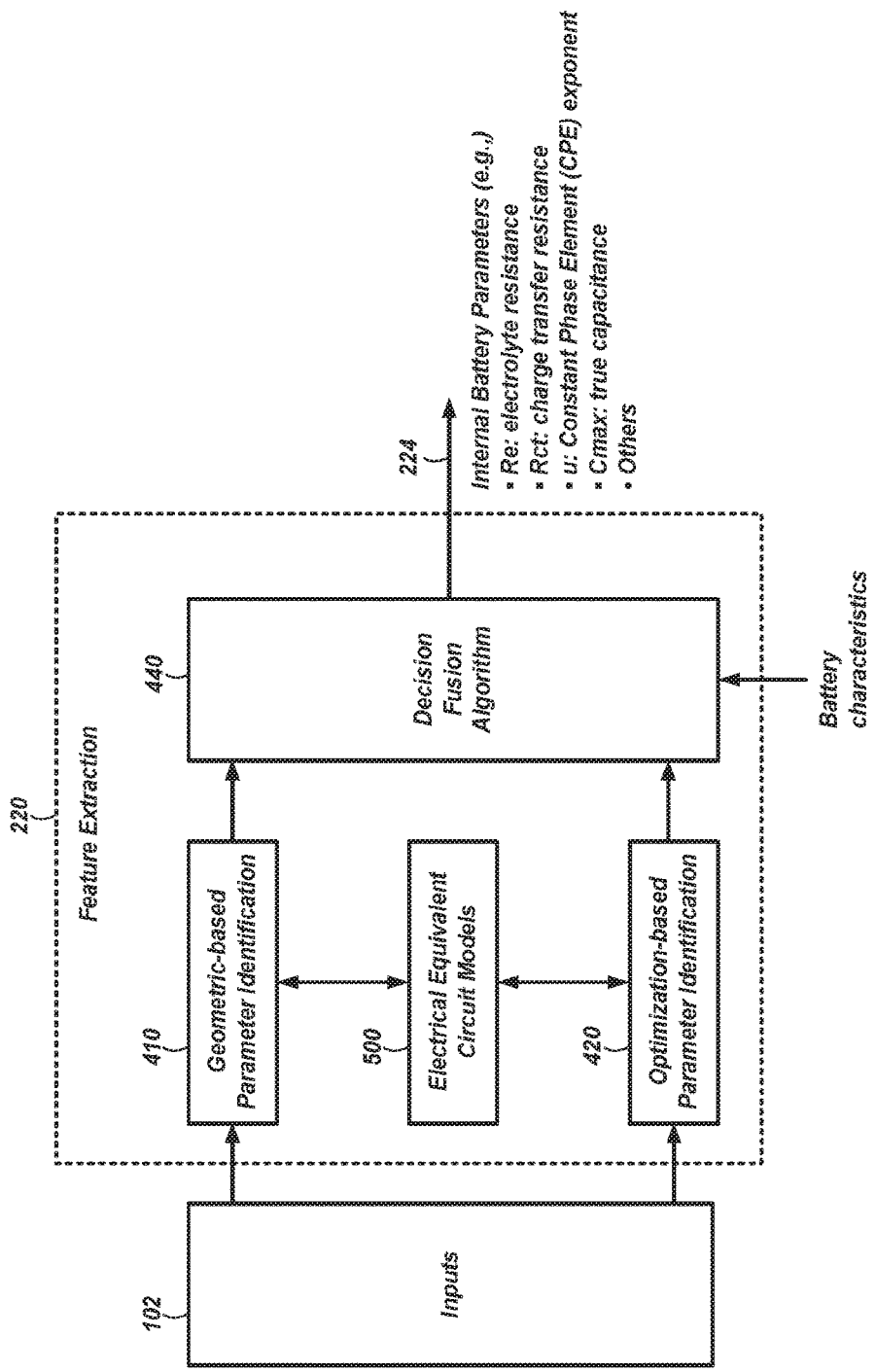
FIG. 4 is a block diagram showing a processing path for internal battery parameter estimation via feature extraction according to the present disclosure.

FIG. 4 is a block diagram showing a processing path for internal battery parameter estimation via feature extraction according to the present disclosure. The role of the feature extraction module 220 is to extract/identify internal parameters of the battery under observation, as formulated in selected models, using collected measurements. These parameters are explicitly included in these models and typically related with meaningful physical characteristics of observed battery systems.

While different models can be used for this purpose of identifying internal battery parameters 224 as discussed above with reference to FIG. 1, an equivalent circuit 500 (FIG. 5) is particularly employed for the feature extraction module 220 shown in detail in FIG. 4. Thus, this feature extraction module 220 utilizes mathematical models to accurately characterize the electrical behavior and impedance characteristics of the battery and assumes the presence of several circuit elements including resistors R, inductors L, and constant phase elements (CCPEs). The parameters to be extracted are thus related to impedance features associated with the battery under observation such as electrolyte resistance ($R_e$), charge transfer resistance ($R_{ct}$), CPE exponents (u), and true capacitance ($C_{max}$) as well as other parameters.

These parameters are used in the present disclosure because they are substantially affected by the electrochemical mechanisms occurring within a battery during its operation and assessed as good health indicators. For example, the electrolyte resistance represents the concentration of the electrolyte or equivalently, the number and mobility of ions or charge carriers available to carry current. Likewise, the charge transfer resistance models the activation polarization and represents the amount of area of a metal substrate available in contact with an electrolyte. Similarly, the CPE exponent has been observed to have a strong correlation with battery health. For example, a decrease in CPE phase $\theta=-u\pi/2$ (which then is a function of u) or equivalently, a larger exponent is strongly correlated to a significant loss in usable capacity and a manifestation of aging. The value of (u) and CPE phase also depends on the battery SOC, thus concluding that there is a correlation between the battery SOC and the exponent and phase of the CPE. These variables serve as indicators to monitor SOC. However, this correlation appears to be nonlinear, being more accentuated at lower values of SOC. The Warburg impedance element represents diffusion.

Measurements used in the present disclosure to derive these internal battery parameters 224 are impedance spectra data. It is useful to recall that at each sample instance k, an impedance spectrum $I_s[k]$ of the battery under observation is collected. An impedance spectra represents the impedance of a battery over a range of frequencies, and therefore its frequency response. Impedance spectra data are typically expressed graphically in a complex impedance plane or Nyquist plot 104 as illustrated in FIG. 1. Consequently, a single measurement $I_s[k]$ consists of a number of tuples, each in turn consisting of a real and imaginary value of the battery impedance computed at a given frequency with the real value plotted on the x-axis and the imaginary value plotted on the y-axis.

Based on this description, it is implicitly indicated that one embodiment of the present disclosure employs a feature extraction module 220 that uses impedance spectra data, although other input data (e.g., voltage and current) may be used. On the other hand, temperature data are used to accordingly modify baseline aging mappings and databases learned and stored when necessary. Temperature sensing may be useful in interpreting impedance data since the spectra change relative to temperature shifts.

Figure 5:
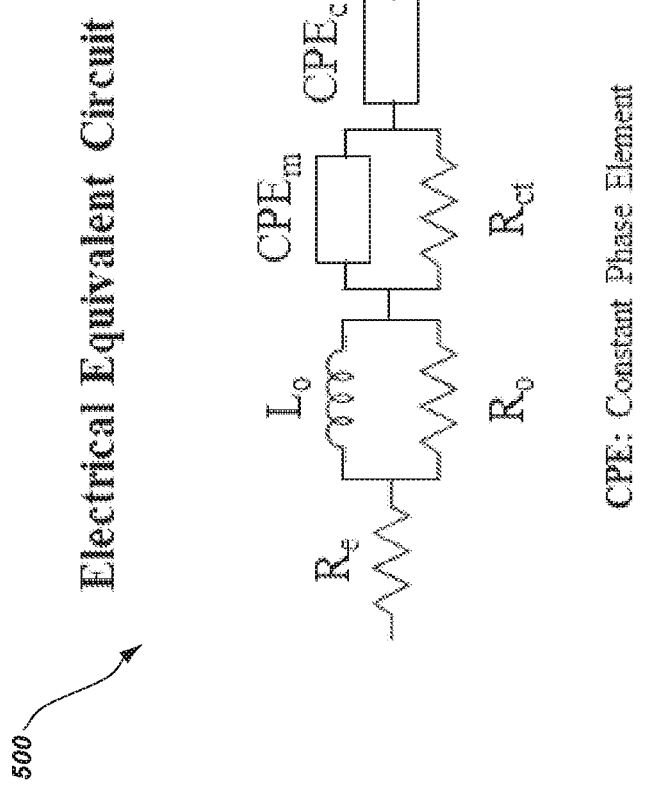
FIG. 5 shows a schematic of an electrical equivalent circuit utilized for feature extraction of internal battery parameters.

In order to extract parameters defined within a given equivalent circuit model as shown in FIG. 5, two distinct algorithms may be used, namely, a geometric-based algorithm shown in a geometric-based parameter identification 410 and an optimization-based algorithm shown in an optimization-based parameter identification 420.

Under the geometric-based approach, an algorithm is used to geometrically identify and extract parameter values. This algorithm takes advantage on how certain elements and circuits geometrically manifest themselves in a complex impedance plane or Nyquist plot 104. For example, a solitary CPE is a straight line that makes an angle of (u*90) with the x-axis, with u being a CPE-exponent value between −1 and 1. Furthermore, the phase of a CPE is equal to $-u\pi/2$ and therefore independent of frequency $\omega$. On the other hand, a circuit arrangement involving a displaced CPE (i.e., a CPE plus a resistor in parallel) manifests itself as a depressed semicircle, with the center of the semicircle depressed and at some distant below the x-axis. Because CPE behavior typically fits impedance spectrum measurement well, this algorithm computes a depressed semicircle that best matches a collected impedance spectrum measurement within an identified frequency range. After this depressed semicircle is identified and placed within the Nyquist plot 104, the electrolyte resistance $R_e$ as shown in FIG. 1, can be readily extracted as the left-side high frequency x-intercept of this depressed semicircle. Likewise, the right-side low frequency x-intercept of the semicircle corresponds to the sum of $R_e$ and the charge transfer resistance (i.e., $R_e+R_{ct}$); this value can then be used to compute $R_{ct}$ having already identified $R_e$. Similarly, the point on the depressed semicircle at which the imaginary component reaches a maximum (i.e., at the top of the depressed semicircle or midway between the high and low frequency x-axis intercepts) can be used to compute true capacitance $C_{max}$. Other parameters can be calculated by geometrically computing, for example, the average slope of a tangent line at a marked point of the collected impedance spectrum graph plotted in the Nyquist plot 104.

The optimization algorithm, on the other hand, is used for optimal estimation of model parameters. In order to apply this approach, an (implicit nonlinear) equation or function is formulated mathematically expressing the impedance of the equivalent circuit 500 shown in FIG. 5. This impedance formulation is a function of not only the parameters to be estimated but also of the frequency at which the particular impedance is computed. Given a measured set of impedance spectra data collected from the battery, the unknown parameters can thus be optimally estimated. Given a measured set of impedance (spectra) data (which each in turn is constituted by a set of real-imaginary impedance tuple evaluated at different frequencies $w_i$) for a monitored battery, the estimation problem is formulated as a nonlinear optimization one. An optimization technique is then used to estimate the battery parameters by minimizing a given objective function.

In general, let's assume that the following nonlinear homogeneous equation is formulated as follows:

$$f_j(Re(I_{w_j}),x)=0$$

$$g_j(Im(I_{w_j}),x)=0$$

where x denotes the parameters vector to be estimated, $I_w$ denotes the battery spectrum impedance at a given frequency $w_j$, Re( ) and Im( ) denote the real and imaginary parts of the measurement impedance data points, respectively, and j is used to identify the jth measured impedance data point. In the present disclosure, the parameter identification problem is formulated as a nonlinear optimization one, where the internal battery parameters 224 are estimated by minimizing a selected objective function. A multiplicity of objective functions may also be used here, such as minimizing the summation of the individual absolute errors (TAB). Assuming its use in the present disclosure, the objective function may be then defined as the summation of IAEs at each given frequency and for any given set of measurements as follows:

$$H = \sum_{i=1}^{N} \left( \sum_{w_i} |f_j(\text{Re}(I_{w_i}), x) + g_j(\text{Im}(I_{w_i}), x)| \right) = 0$$

where N is the number of impedance data points.

In principle and as implied above, the objective function should be zero for any measured set of impedance spectra data when the exact value has been determined for each parameter. However, a small non-zero value is in practice obtained due to the presence of modeling and measuring noise errors. The complex fitting of impedance data requires a parameter optimization that simultaneously minimizes the distance of real and imaginary parts between measurement impedance points and model prediction. A multiplicity of numerical methods, including curve fitting techniques and optimization methods, can be utilized here to solve such a function. Some example effective techniques accommodated by the present disclosure include the following techniques. For stochastic search and optimization, simulated annealing (SA), simultaneous perturbation stochastic approximation (SPSA), and genetic algorithms may be used, selecting that technique which may provide best performance based on particular battery characteristics. The task of the selected stochastic search and optimization algorithm is to minimize the selected objective function with respect to the parameter set. For a given measurement Is[k], the objective function should be less than a given tolerance threshold (as part of the stopping criteria) when an appropriate value has been determined for each parameter. For effective computational performance, estimated values for battery parameters computed from previous impedance measurements can be used.

After internal battery parameters have been estimated using the geometric-based parameter identification 410 and optimization-based parameter identification 420, a decision fusion algorithm 440 is employed to accordingly output a single value for each parameter. Information regarding battery characteristics (e.g., chemistry) may be used here to appropriately weigh parameter estimations based on observed algorithm performance.

It should be noted here that various decision fusion algorithms are discussed herein. Specifically, among others, there is the decision fusion algorithm 440 for internal battery parameters 224, decision fusion algorithms for SOH 622, 624, 626, and 640 shown in FIG. 6, a decision fusion algorithm 740 for SOC shown in FIG. 7, and a decision fusion algorithm 840 for RUL and EOL shown in FIG. 8. These decision fusion algorithms are similar in that they fuse data from multiple sources, but perform different functions and algorithms to adapt to the various inputs and outputs used in each decision fusion. Specific details regarding various decision fusion algorithm considerations are discussed below with reference to the decision fusion algorithms in FIG. 6.

FIG. 5 shows a schematic of an electrical equivalent circuit 500 utilized for feature extraction of internal battery parameters. This electrical equivalent circuit 500 characterizing electric impedance behavior of a battery under observation is used under the present disclosure as it has a physically sound interpretation and adequately fits experimental data. This equivalent circuit 500 can be divided and explained into four main sections, each being dominant at different frequency regions of the impedance spectra. In particular and moving from left to right in FIG. 5, the resistor $R_e$ characterizes the electrolyte resistance of the battery. Next, the partial-circuit consisting of an inductor $L_o$ in parallel with a resistor $R_o$ characterizes the inductive behavior of imperfect wiring. Next, the partial-circuit consisting of a resistor $R_{ct}$ (representing the charge transfer resistance) in parallel with a constant phase element $CPE_m$, corresponds to the depressed semicircle that typically appears in Nyquist plots 104 (FIG. 1) of (electrochemical) impedance spectrum data collected from real-world battery systems as previously discussed. Finally, the $CPE_c$ characterizes cathode intercalation.

This electrical equivalent circuit 500 representing battery behavior is used by the geometric-based parameter identification algorithm 410 and optimization-based parameter identification algorithm 420 (FIG. 4) to compute internal battery parameters such as $R_e$, $R_{ct}$, $C_{max}$, and u. This model or sections of this model are thus utilized to produce parameter estimations that minimize error calculations with respect to the corresponding measurement points. If employed for feature extraction, the geometric-based parameter identification 410 uses and tunes geometric figures towards best fitting collected impedance spectra curves. After this step is completed, estimates for battery parameter are outputted. On the other hand, the optimization-based parameter identification 420 uses a mathematical equation derived from this electrical circuit model (or a section of it) and executes an optimization technique to minimize a selected objective function that includes impedance spectra measurements. After this step is completed, estimates for battery parameter are outputted.

Figure 6:
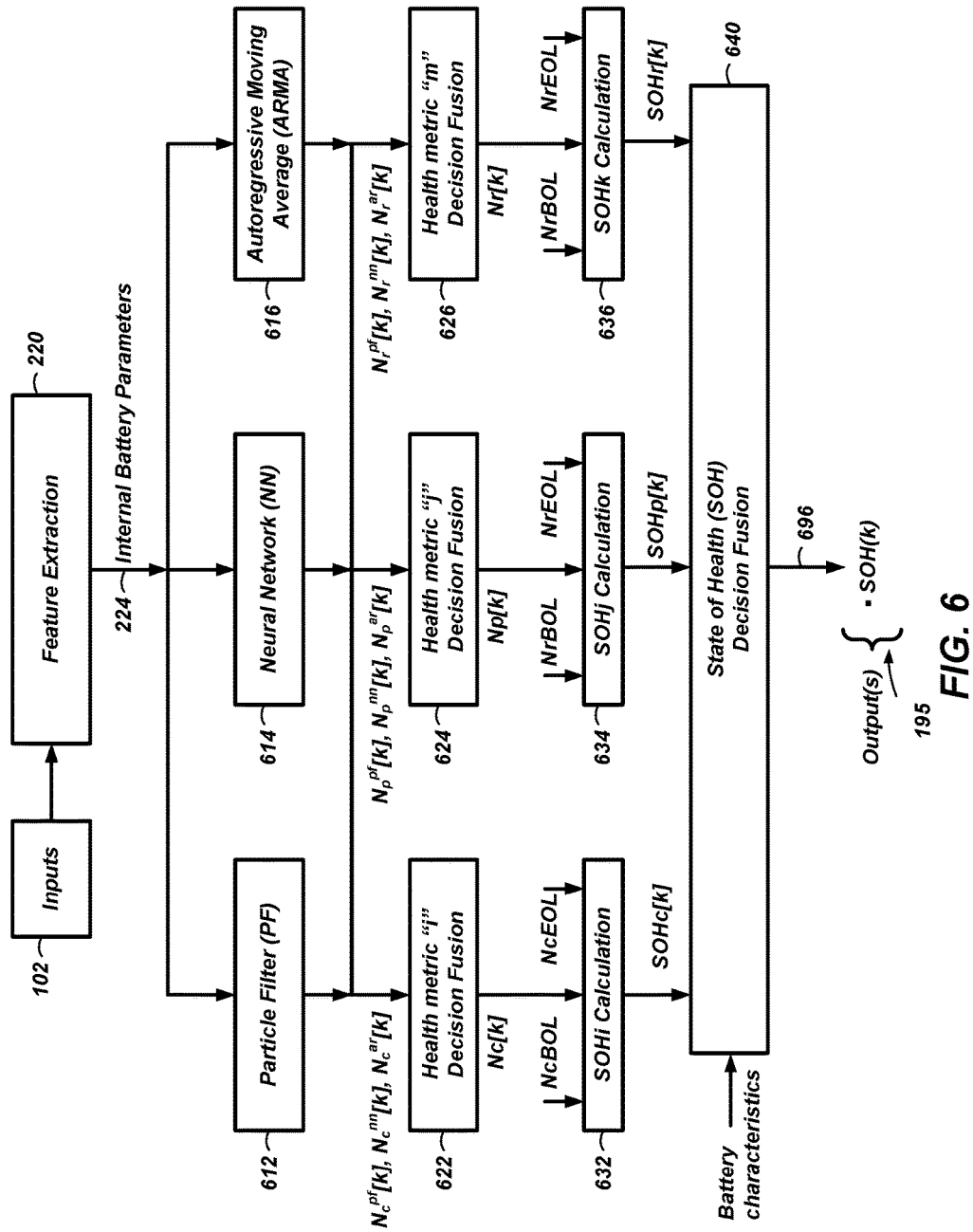
FIG. 6 is a block diagram showing processing paths for state-of-health (SOH) estimation.

FIG. 6 is a block diagram showing processing paths for state-of-health (SOH) estimation. There are four stages and three parallel paths for the estimation of the SOH of the battery under observation based on calculated internal battery parameters 224 computed by the feature extraction module 220 using the input data 102 as described above with reference to FIGS. 2 and 4.

The first stage is to compute a given health metric following a specific estimation algorithm. In order to have a more comprehensive assessment of health conditions, three distinct health metrics $N_i$ are used in the present disclosure to compute SOH, namely, capacity ($N_c$), available power ($N_p$), and pulse resistance ($N_r$).

The introduction of these three different health metrics results in the three parallel paths mentioned. In order to estimate a given health metric (e.g., capacity, available power, or pulse resistance), a multiplicity of estimation algorithms can be used. The present disclosure utilizes three different algorithms, namely, particle filtering (PF) 612, neural network (NN) 614, and autoregressive moving average (ARMA) 616. Each of these algorithms has its strength, with PF showing high robustness, accuracy, and flexibility. These algorithms are trained and used to compute the selected health metrics. By using them, three different estimates $N_i^j$ (i: c, p, r; j: pf, nn, ar) are computed per each health metric (i.e., c: capacity, p: available power, r: pulse resistance) defined according to the particular algorithm (i.e., PF, NN, AR) used in the calculations.

In the present disclosure, the estimated internal battery parameters or health indicators are mapped directly into corresponding health metric estimates $N_i^j[k]$ (j=NN, AR) under the NN and ARMA methods using their particular structures and parameters previously learnt from experimentation. On the other hand, a battery vector state x(k) is computed first under the PF method based on estimated internal battery parameters as follows:

$$x[k+1]=f(x[k],v[k])$$

$$z[k]=h(x[k],n[k])$$

where z[k] denotes the observation vector (i.e., estimated internal battery parameters), and v[k] and n[k] denotes process and measure noises, respectively, which do not have to be modeled as normal (Gaussian) random variables.

Furthermore, the state f(•) and sensory/observation h(•) models do not have to be known linear functions or matrices. In fact, non-linear models, non-Gaussian noise or posterior, and multi-modal and skewed distributions are accommodated by the present disclosure. The state x[k] at time k is then directly mapped into the corresponding $N_i^{PF}[k]$ using mapping functions previously learnt from experimentation. Using these three paths, three different sets of estimates are available for each health metric $N_i$ (i.e., $N_c$, $N_p$, and $N_r$) used in the present disclosure to compute SOH.

Three decision fusion algorithms, namely a health metric "i" decision fusion 622 (also referred to herein as capacity heath metric) for capacity, a health metric "j" decision fusion 624 (also referred to herein as an available power heath metric) for available power, and a health metric "m" decision fusion 626 (also referred to herein as a pulse resistance power heath metric) for pulse resistance, are then used to integrate these calculations into three streams of combined estimates for $N_i$ (i.e., $N_c$, $N_p$, and $N_r$). In general, a decision fusion algorithm may weigh the three estimates associated with a given $N_i$ (e.g., $N_c$) based on a confidence measure constructed from using different factors such as information about these algorithms and observed performance.

Different techniques and algorithms can be used to implement decision fusion algorithms and include various metrics. A simple approach may be to compute the given $N_i$ by averaging the particular $N_i$ values computed following each path. Another approach is to weigh each given $N_i$ estimation value differently using predetermined weights and add all them together, where the particular weight parameters to be used result from observing the performance of each of these algorithms under experimentation. Voting, cluster, min/max, or proximity schemes may also be used here, keeping those predictions assessed more likely to be correct and discarding the remaining one, while assigning a confidence to the combined calculation.

As shown in FIG. 6, given the estimation $N_i[k]$ of a given health metric i (i=c for capacity, p for available power, and r for pulse resistance) at time instance k, the $SOH_1[k]$ based on this metric is computed as follows:

$$SOH_i[k] = \frac{(N_i[k] - N_i^{EOL})}{(N_i^{BOL} - N_i^{EOL})}$$

where $N_i^{BOL}$ and $N_i^{EOL}$ denotes the corresponding beginning-of-life (BOL) and end-of-life (EOL) criteria, respectively, defined for the particular metric i. Thus, an $SOH_c$ calculation 632 is performed for capacity, an $SOH_p$ calculation 634 is performed for available power, and an $SOH_r$ calculation 636 is performed for pulse resistance.

An SOH decision fusion algorithm 640 combines the SOH values from each SOH calculation 632, 634, and 636. In order to compute the aggregated SOH[k] 696 of the battery as output data 195, different decision fusion algorithms can be used to aggregate these individual assessments. For example, this decision fusion algorithm 640 may weigh these three estimates based on a confidence measure constructed from using different factors such as information about these algorithms and observed performance. A weighting criterion based on expert knowledge and data availability may be used as follows:

$$SOH[k]=g(SOH_i[k],w_i)$$

where $w_i$ denotes weights defining the relative importance of a given health metric (i) with respect to the others. Likewise, a simple conservative decision fusion algorithm may also be used that equals the aggregated SOH[k] to the worst value of $SOH_i[k]$ among all partial estimates computed under each health metric i as follows:

$$SOH[k] = \min_i [SOH_i[k]].$$

Figure 7:
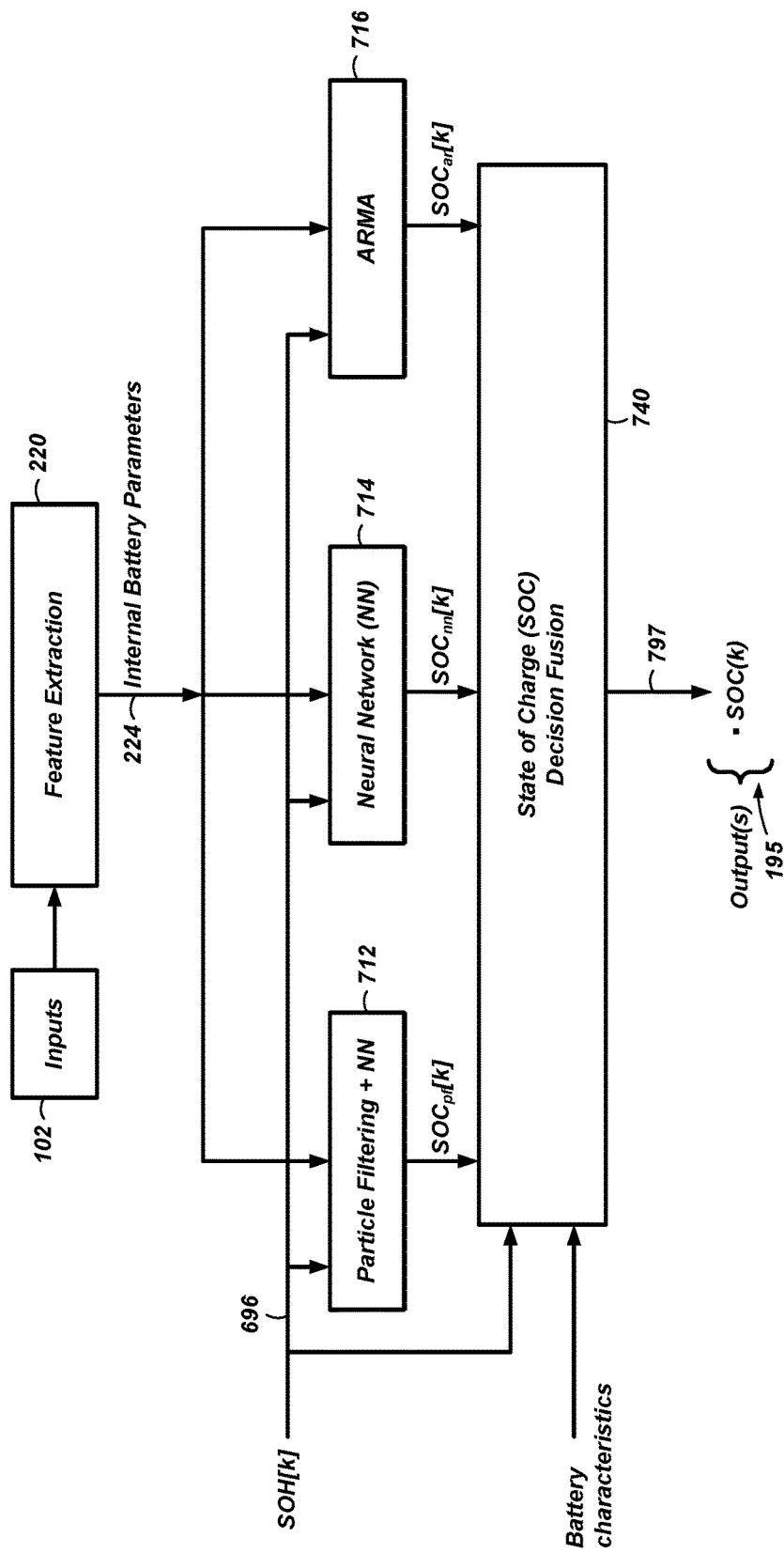
FIG. 7 is a block diagram showing processing paths for state-of-charge (SOC) estimation.

FIG. 7 is a block diagram showing processing paths for state-of-charge (SOC) estimation. There are three distinct parallel paths for the estimation of the SOC of the battery under observation based on calculated internal battery parameters 224 computed by the feature extraction module 220 using the input data 102 as described above with reference to FIGS. 2-4.

The present disclosure utilizes three different algorithms, namely, particle filtering (PF), neural network (NN) algorithm 714, and autoregressive moving average (ARMA) 716. These algorithms are trained and used to compute the SOC estimations SOCi[k] (i=pf for particle filtering+neural network, nn for neural network, and ar for ARMA). In particular, the first path includes an approach integrating PF and NN 712. In this path, the PF is first used to estimate the battery internal states based on internal battery parameters 224 estimated by the feature extraction module 220. The observable variables (observation process) are related to the hidden variables (state-process) by a known functional form. In some embodiments, these states are chosen to be the same observation variables being estimated by feature extraction.

Notice that the evolution of these state variables is also known probabilistically. In this way, the PF essentially acts as a filter for signal processing and smoothing, where the filtering process includes estimating the internal battery states under noisy and partial observations and random (not necessarily Gaussian) perturbations present in sensors, feature extraction algorithms, and in the battery itself. The state estimates computed by this PF algorithm are then used by an NN to compute SOC.

The mapping embedded in this NN to translate states estimations into SOC values has been previously learned from experimentation. Learning of the NN occurs by presenting it with data tuples of two elements collected at the same time tag in which the first element corresponds to an internal parameter value (e.g., $R_{ct}$, or $R_e+R_{ct}$) computed by a given method (e.g., the mentioned feature extraction module 220) and the second element corresponds to the associated SOC value collected independently using a different but accurate method. A benefit of the approach implemented in this first path comes from the smoothing action performed by the PF algorithm.

On the other hand, the second and third paths directly map estimated internal parameters to SOC calculations. In particular, the second path utilizes an NN algorithm 714 to directly translate parameters estimated by feature extraction into SOC values. This NN is trained similarly to the one used for training the NN under the first path. The objective of this second path, as it is compared to the first, is to effectively remove the filtering/smoothing action of the PF algorithm. In this way, the NN algorithm 714 in the second path learns and stores within its own structure the noisy dynamics present in the estimated internal battery parameters 224.

Similarly, the third path utilizes an ARMA algorithm 716 to directly translate parameters estimated by feature extraction into SOC values. Given the time series of estimated battery parameter data, this ARMA model 716 is used for finding the values of the parameters, which minimize an error term and for also predicting future values in this series. As non-limiting examples, the ARMA model 716 may be fitted by least squares regression or by using Yule-Walker equations. Using these three paths, three different sets of SOC estimates are available.

A decision fusion algorithm 740 is then used to integrate these calculations into a single stream of SOC(k) 797 combined estimates. In general, this decision fusion algorithm 740 weights these three SOC estimates based on a confidence measure constructed from using different factors such as information about these algorithms and observed performance. Different techniques and algorithms can be used to implement this decision fusion algorithm 740 model. A simple approach may be to compute the SOC by averaging the SOC values computed following each path. Another approach is to weigh each SOC, estimation value differently using predetermined weights and add all them together, where the particular weight parameters to be used result from observing the performance of each of these algorithms under experimentation. Furthermore, these weights can be made dependent to SOC in order to rely more on those algorithms shown best in performance for a particular SOC range. Voting, cluster, or proximity schemes may also be used here, keeping those predictions assessed more likely to be correct and discarding the remaining one, while assigning a confidence to the combined calculation.

Figure 8:
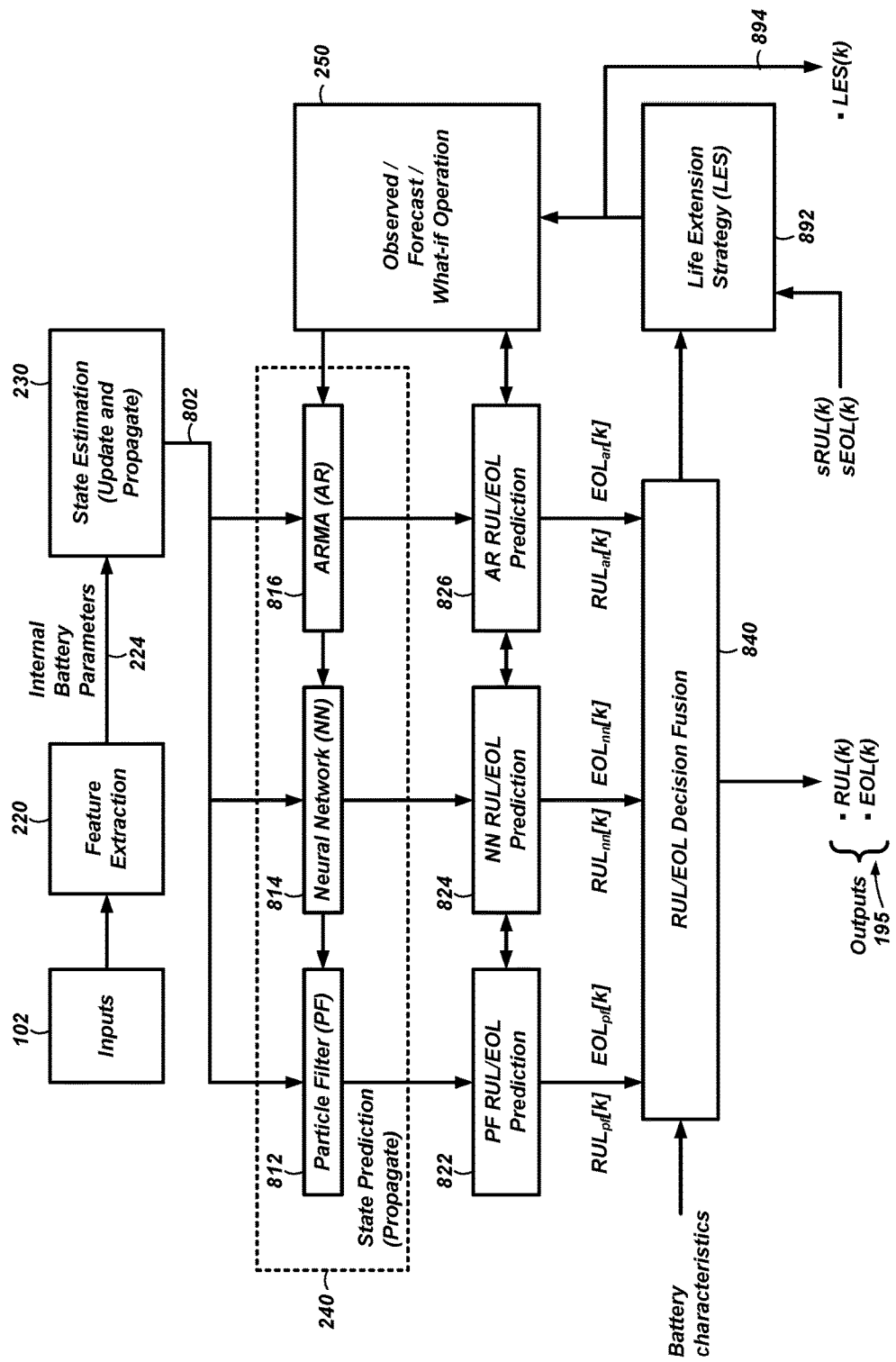
FIG. 8 is a block diagram showing processing paths for decision fusion of remaining-useful-time (RUL) and end-of-life (EOL) predictions computed from diverse state prediction algorithms.

FIG. 8 is a block diagram showing processing paths for decision fusion of remaining-useful-time (RUL) and end-of-life (EOL) predictions computed from diverse state prediction algorithms. Similar to the approaches taken for estimating SOH and SOC illustrated in FIGS. 6 and 7, respectively, three distinct but complementary paths with their associated algorithms are used to compute RUL and EOL, namely, PF 812, NN 814, and ARMA 816. As computing RUL and EOL relates to predicting future values of battery parameters and states, each of these paths uses a model indicating the assumed future operational conditions under which the battery will be operated, as defined by the observed, forecast, what-if module 250. This model characterizes how the battery is anticipated to age with time as it is operated. As different failure mechanisms will age the battery differently at different aging rates, the prediction performance highly depends on several factors and strategies such as correctly identifying the dominant failure mechanism for the operational condition considered and thus using the corresponding aging model, using more than a single aging model in order to consider different failure mechanisms, or even using aggregated time-varying aging models to consider situations where more than one failure mechanism may be aging the battery, with their relative dominance potentially changing with time as time progresses. Likewise, three future operational conditions of interest for exploration and prediction may be devised, namely, observed, forecast, and what-if 250.

Under the observed selection of the observed, forecast, what-if module 250, the (average) operational conditions that have been actually observed are used as the assumed future operational conditions to which the battery will be subjected. An aging model $\varphi(\cdot)$ is here used that has been assumed and tuned from collected observations. The general structure of this aging model $\varphi(\cdot)$ is assumed to be as follows:

$$R[k]=\varphi(R_0,\lambda,\Delta_t,k)$$

where R is a specific battery parameter or feature (e.g., the electrolyte resistance $R_e$ or the charge transfer resistance $R_{CT}$) of interest (to be extracted by the feature extraction), $R_0$ is the value of R when the battery is new, $\lambda$ is a parameter that characterizes how R changes as time progresses, and $\Delta_t$ is the time between consecutive time instances k's. Several structures can be used here, including the following one:

$$R[k]=R_0\exp(\lambda k\Delta_t).$$

While different regression and machine learning techniques can here be used to estimate internal parameters of the considered aging model, some embodiments of the present disclosure use a relevance vector machine (RVM) algorithm to accomplish this task using Bayesian inference to obtain parsimonious solutions for regression. In order to use RVM, such embodiments may assume, for example, that the calculated feature and time may be related by a given model as follows:

$$R[k]=w^T\varnothing[k]+\epsilon_k$$

where w denotes a vector of weights (to be learned), $\varnothing[\cdot]$ is a vector valued nonlinear mappings, and $\epsilon_k$ are independent random variables. Thus, RVM can be used to compute the most likely values of the weights in w in the equation above. Using the values of $R_{RVM}[k]$, the parameters $R_0$ and $\lambda$ can be calculated using regression methods.

As previously indicated, a historic set of data or distinct sets of data generated at different operational conditions of interest may be collected offline by various battery testing procedures. This information may then be used to construct an aging model or a multiplicity of aging models considering different failure mechanisms of the battery through learning algorithms. These aging models will age the battery in distinct manners and at different rates, hence they may have different formulations. Furthermore, aggregated time-varying aging models may also be constructed and used to characterize situations where more than one failure mechanism may age the battery, with their relative dominance potentially changing with time as the battery is operated.

Under the forecast selection of the observed, forecast, what-if module 250 illustrated in FIG. 8, an operational model indicating what is predicted to be exerted over the battery may be used. This selection is useful in numerous cases. For example, assume that a given battery bank has been operated under relatively warm temperature conditions; however, the weather forecast indicates that a very cold front is expected to hit this battery bank. This information can then be used under this selection to determine how this cold front may affect future battery health and operation.

Under the what-if selection of the observed, forecast, what-if module 250, different fabricated operational scenarios can be used in support of what-if evaluations. This selection model becomes particularly useful when identifying optimal operational strategies that would allow the battery to meet specified RUL/EOL requirements as it is operated. Thus, an optimized operational schedule can be identified, for example, in order to extend the RUL of the battery as far as possible (from a given time moment) to meet requirements. An optimized battery schedule may also be found to meet specifications at a given time instant p time unit from a given moment k.

This capability is illustrated in FIG. 8 with the Life Extension Strategy (LES) module 892. To briefly explain its operation, assume it is required that the RUL of the battery being a given value sRUL[k] at the current time instant k or the battery being a given value sEOL[k] at the current time instant k. Thus, this module first selects a given operational profile, which then translates to a specific aging model used to predict future values of battery parameters, battery states, or a combination thereof. These estimations are then used to compute RUL[k]. If this estimate does not meet given needs, the model then picks/modifies the assumed operating profile and repeats this cycle, which is terminated when RUL[k] meets the specification sRUL[k] desired at k. Thus, the LES module 892 computes output 894 as LES(k).

In FIG. 8, under the first path, PF 812 is used to predict (propagate) the battery state assuming the selected operation (or aging) model. Given these state predictions, stored mappings (previously learned from experimentation) are used to compute different metrics associated with SOH as illustrated and discussed below with reference to FIG. 9.

In the embodiment of FIG. 8, three health metrics are used to compute SOH, namely, capacity, available power, and pulse resistance from state estimates 802. SOH predictions are subsequently used to compute RUL and EOL. As PF 812 computes the probability distribution of the battery internal states at each time instant, then RUL and EOL are provided as probability distributions as well. However, because the two other paths (NN 814 and ARMA 816) compute single values for RUL and EOL at each time instant (as opposed to probability distributions), representative values for RUL, denoted by $RUL_{pf}[k]$, and EOL, denoted by $EOL_{pf}[k]$, are computed by the PF RUL/EOL prediction module 822 under the PF path from their distributions at each time instant k to be used in the decision fusion module 840. Considering that diverse possibilities existing here, this representative value may be selected to be the mean value or the maximum value, for example, of the calculated distributions.

Likewise, under the second and third paths, the NN 814 and the ARMA 816 models are used to predict future values in the time series regarding the different health metrics, respectively, assuming selected future operational conditions/profiles. These health metric predictions computed using NN 814 or ARMA 816 algorithms under each path respectively are then used to compute predictions for RUL and EOL using an NN RUL/EOL prediction module 824 and an ARMA RUL/EOL prediction module 826, respectively.

A decision fusion module 840 then computes a single value for RUL[k] and EOL[k] as output data 195 at each time instant k based on the estimated values is computed under each path. In general, this decision fusion algorithm weights these three estimates based on a confidence measure constructed from using different factors such as information about these algorithms and observed performance. As described for FIGS. 6 and 7, this decision fusion can be implemented in different manners; e.g., by taking the average value or using a weighted sum model.

Figure 9:
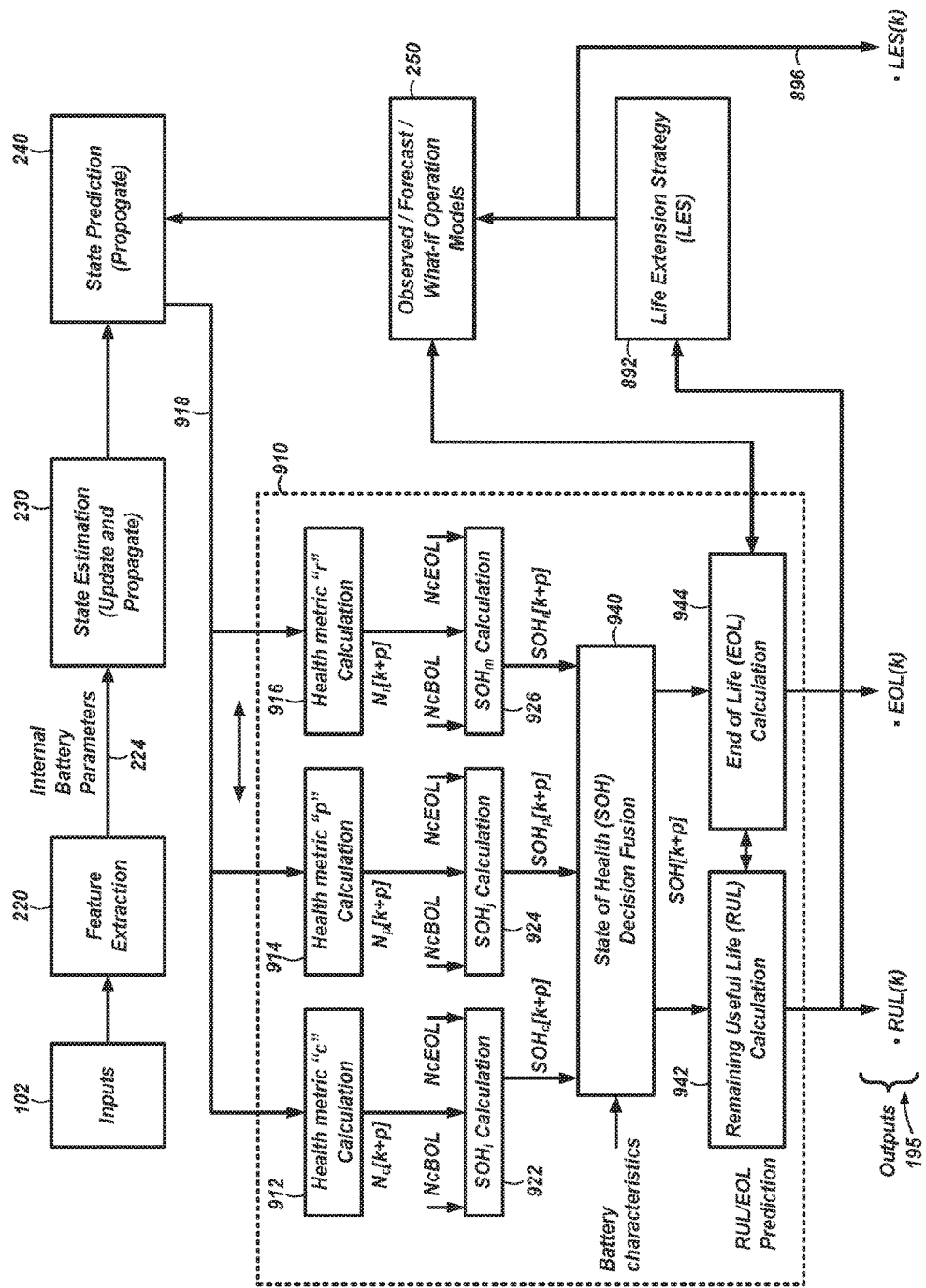
FIG. 9 is a block diagram showing processing paths for remaining-useful-time (RUL) estimation and end-of-life (EOL) estimation based on several health metric calculations.

FIG. 9 is a block diagram showing processing paths 910 for remaining-useful-time (RUL) prediction and end-of-life (EOL) prediction based on several health metric calculations. The elements of input data 102, the feature extraction module 220, the internal battery parameters 224, the state estimation module 230, the state prediction module 240 the observed, forecast, what-if module 250, output 896 for LES(k), and output data 195 are the same as described above with reference to FIGS. 1-4 and 8.

In addition, for a particular processing path, FIG. 9 details some of the blocks illustrated in FIG. 8 and utilized for computing RUL and EOL. In particular, the health metric "i" calculation modules use state prediction information 918 to compute the value of a given health metric "i" (i=c, for capacity, p, for available power, and r, for pulse resistance) $N_i[k+p]$ at a future time instance k+p based on the estimates of battery states or parameters predicted at k+p assuming a given operation or aging model. Thus, a health metric "c" calculation 912 develops a $N_c[k+p]$ capacity metric, a health metric "p" calculation 914 develops a $N_p[k+p]$ power metric, and a health metric "r" calculation 916 develops a $N_r[k+p]$ capacity metric.

These mappings from battery parameter values (or health indicators) to health metrics have been built/learned from observations, and their particular makings depends on the specific processing path (i.e., PF, NN, ARMA) considered. Three distinct algorithms compute three parallel future estimates for each health metric $N_i[k+p]$.

As described before for FIG. 6, three decision fusion algorithms 922, 924, and 926 are then used to integrate these calculations into three streams of combined estimates of health metrics $N_i[k+p]$. In general, the decision fusion algorithms 922, 924, and 926 may weigh estimates based on beginning-of-life (BOL) and end-of-life (EOL) criteria along with the corresponding health metric $N_i[k+p]$ along with a confidence measure constructed from using different factors, such as information about these algorithms and observed performance. Voting, cluster, or proximity schemes may also be used here, keeping those predictions assessed more likely to be correct and discarding the remaining one, while assigning a confidence to the combined calculation.

With three health metrics considered in the present disclosure, then three distinct calculations for SOH at time k+p are available, which are combined at the SOH decision fusion block 940. As shown in FIG. 9, an aggregated estimate of SOH at future time k=p (i.e., SOH[k+p]), is then available for further processing.

An RUL calculation block 942 is responsible for predicting the time at which the battery will no longer perform its intended function and the battery can no longer meet desired performance. By this definition, SOH is equal to zero at that moment and the predicted time then becomes the RUL. Consequently, the RUL calculation block 942 evaluates whether SOH[k+p] is zero, which would imply that the RUL is equal to (p). If this is not the case, then (p) is accordingly increased and new predictions for battery parameters, states, and SOH are recomputed assuming selected operational/aging model until RUL equals zero.

As EOL is related to RUL, its calculation is derived from that of RUL in an EOL calculation block 944. As mentioned, the architectural structure shown in FIG. 9 is repeated for each processing path based on PF, NN, and ARMA, respectively.

The present disclosure uses multiple baseline mappings that may be learned, constructed, and/or stored on a particular battery or on numerous battery systems of interest. These mappings are used for supporting the estimation and prediction of health-related calculations. In order to relate these mappings with the particular application at hand, this disclosure envisions that unique identifiers may be first entered before its use in order to uniquely identify particular battery characteristics such as vendor, model, chemistry, and rated capacity so that the correct database is used during the estimation and prediction of battery conditions.

It is well-understood that chemical processes in batteries slow down with lower temperature. This is because diffusion slows down, and the average kinetic energy of the molecules is reduced. Being representations of electrochemical reactions and transport processes inside the battery, the impedance parameters are strongly affected by the internal temperature of the battery, the current load, and the ionic concentrations. Thus, an increase of temperature will cause a decrease in resistance and vice versa, assuming an electrolyte of a given concentration. Some embodiments of the present disclosure uses temperature data in order to online adjust stored databases and mappings to accommodate temperature differences between the temperature at which a given database/mapping was constructed and the actual (internal) temperature of the battery measured.

Figure 10:
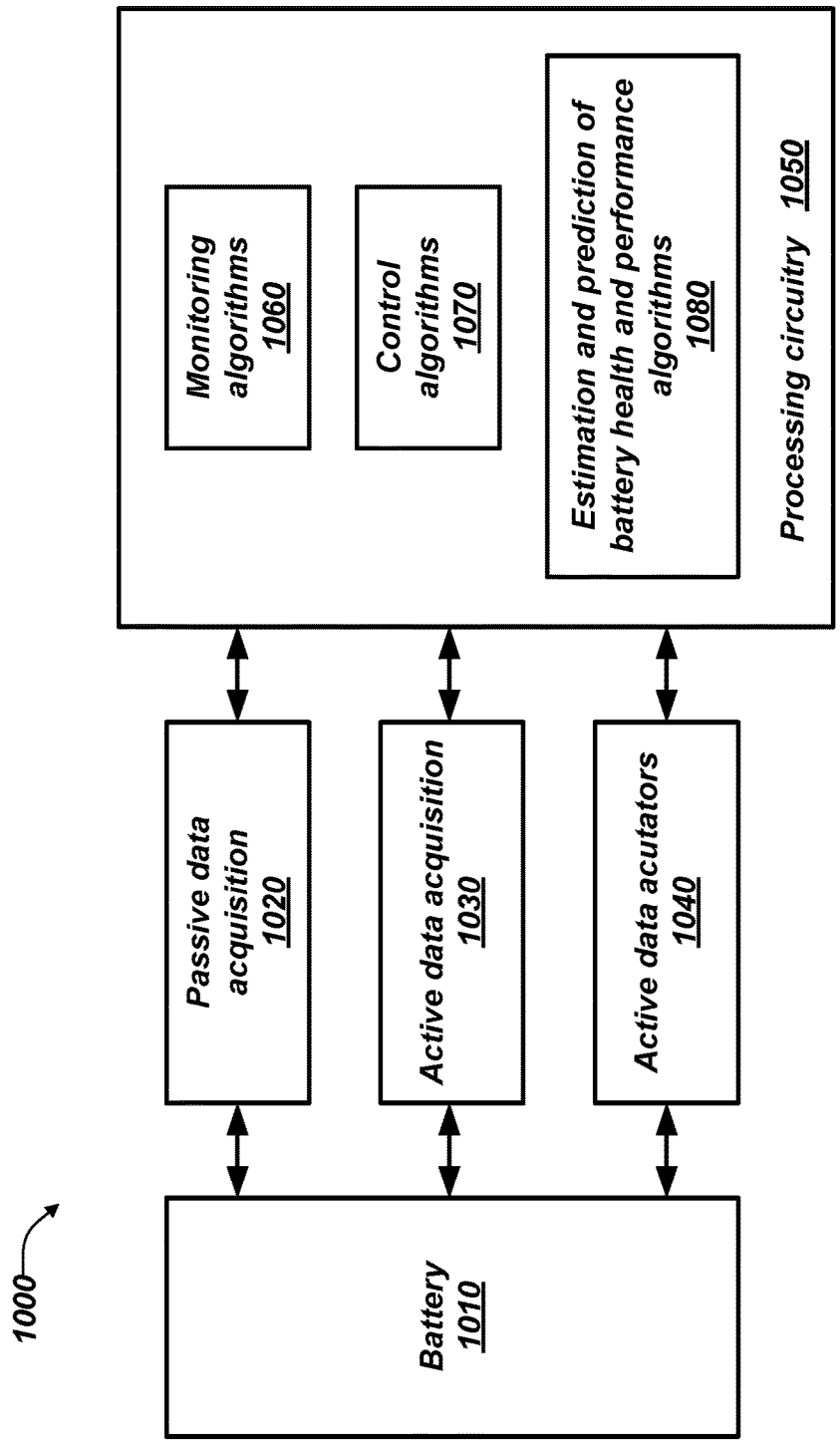
FIG. 10 is a block diagram showing an example of one type of hardware system that may be used for acquiring data to be used in embodiments of the present disclosure as an onboard battery monitoring and control system using passive measurements, online active measurements, or a combination thereof.

FIG. 10 is a block diagram showing an example of one type of hardware system 1000 that may be used for acquiring data to be used in embodiments of the present disclosure as an onboard battery monitoring and control system using passive measurements, online active measurements, or a combination thereof.

A passive data acquisition module 1020 may be used to collect information such as, for example, temperature, voltage, and current of the battery 1010 in online and offline conditions.

An active data acquisition module 1030 may be used to collect information such as EIS data for the battery 1010 in online conditions. Active data actuator(s) 1040 may be used to inject signals into the battery 1010 such that the active data acquisition module 1030 can measure a response to these signals.

Processing circuitry 1050 (e.g., a computer) may include processes for embodiments of the present disclosure such as, for example, monitoring algorithms 1060, control algorithms 1070, and the estimation and prediction of battery health and performance algorithms 1080 described above with reference to FIGS. 1-9.

Figure 11:
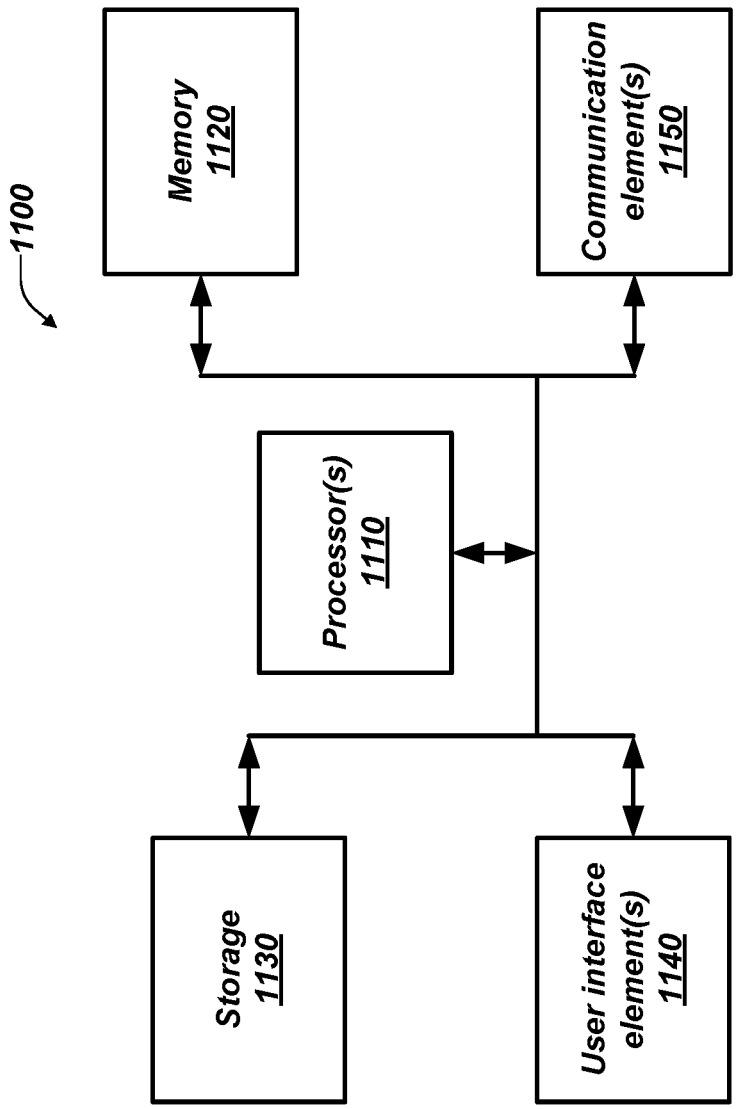
FIG. 11 illustrates a computing system for practicing embodiments of the present disclosure.

FIG. 11 illustrates a computing system 1100 for practicing embodiments of the present disclosure. As non-limiting examples, the computing system 1100 may be a user-type computer, an embedded system, a file server, a compute server, a notebook computer, a tablet, a handheld device, a mobile device, or other similar computer system for executing software. Computer, computing system, and server may be used interchangeably herein to indicate a system for practicing embodiments of the present disclosure. The computing system 1100 is configured for executing software programs containing computing instructions and includes one or more processors 1110, memory 1120, storage 1130, user interface elements 1140, and one or more communication elements 1150.

The one or more processors 1110 may be configured for executing a wide variety of operating systems and applications including computing instructions for carrying out embodiments of the present disclosure.

The memory 1120 may be used to hold computing instructions, data structures, and other information for performing a wide variety of tasks including performing embodiments of the present disclosure. By way of example, and not limitation, the memory 1120 may include Synchronous Random Access Memory (SRAM), Dynamic RAM (DRAM), Read-Only Memory (ROM), flash memory, and the like.

The memory 1120 may include other types of memory devices, including volatile storage devices or non-volatile storage devices, configured to store information. Examples of other types of memory 1120 include nano RAM or (NRAM), nanocrystal wire-based memory, silicon-oxide based sub-10-nanometer process memory, graphene memory, Silicon-Oxide-Nitride-Oxide-Silicon (SONOS), Resistive random-access memory (RRAM), programmable metallization cell (PMC), conductive-bridging RAM (CBRAM), magneto-resistive RAM (MRAM), phase change RAM (PCRAM), phase change memory, or other solid-state storage media.

The storage 1130 may be used for storing relatively large amounts of non-volatile information for use in the computing system 1100 and may be configured as one or more storage devices. By way of example, and not limitation, these storage devices may include computer-readable media (CRM). This CRM may include, but is not limited to, magnetic and optical storage devices such as disk drives, magnetic tapes, optical storage drives such as CDs (compact discs), DVDs (digital versatile discs or digital video discs), and other equivalent storage devices.

Information related to the computing system 1100 may be presented to, and received from, a user with one or more user interface elements 1140. As non-limiting examples, the user interface elements 1140 may include elements such as displays, keyboards, mice, joysticks, haptic devices, microphones, speakers, cameras, and touchscreens. A display on the computing system may be configured to present a graphical user interface (GUI) with information about the embodiments of the present disclosure.

The communication elements 1150 may be configured for communicating with other devices or communication networks. As non-limiting examples, the communication elements 1150 may include elements for communicating on wired and wireless communication media, such as, for example, serial ports, parallel ports, Ethernet connections, universal serial bus (USB) connections IEEE 1394 ("firewire") connections, lightning connections, THUNDERBOLT® connections, BLUETOOTH® wireless connections, 802.1 a/b/g/n type wireless connections, cellular phone connections, TCP/IP, FTP, HTTP, and other suitable communication interfaces and protocols.

Software processes illustrated herein are intended to illustrate representative processes that may be performed by the systems illustrated herein. Unless specified otherwise, the order in which the processes acts are described is not intended to be construed as a limitation, and acts described as occurring sequentially may occur in a different sequence, or in one or more parallel process streams. It will be appreciated by those of ordinary skill in the art that many steps and processes may occur in addition to those outlined in flow charts. Furthermore, the processes may be implemented in any suitable hardware, software, firmware, or combinations thereof.

By way of non-limiting example, computing instructions for performing the processes may be stored on the storage 1130, transferred to the memory 1120 for execution, and executed by the processors 1110. The processors 1110, when executing computing instructions configured for performing the processes, constitutes structure for performing the processes and can be considered a special-purpose computer when so configured. In addition, some or all portions of the processes may be performed by hardware specifically configured for carrying out the processes.

Many of the functional units described in this specification may be labeled as modules, threads, or other segregations of programming code, in order to more particularly emphasize their implementation independence. Modules may be at least partially implemented in hardware, in one form or another. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented using software, stored on a physical storage device 1130 (e.g., a computer readable storage medium), in memory 1120, or a combination thereof for execution by various types of processors.

An identified module of executable code may, for instance, comprise one or more physical or logical blocks of computer instructions, which may, for instance, be organized as a thread, object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several storage 1130 or memory 1120 devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more physical devices, which are referred to herein as computer readable media.

In some embodiments, the software portions are stored in a non-transitory state such that the software portions, or representations thereof, persist in the same physical location for a period of time. Additionally, in some embodiments, the software portions are stored on one or more non-transitory storage devices, which include hardware elements capable of storing non-transitory states and/or signals representative of the software portions, even though other portions of the non-transitory storage devices may be capable of altering and/or transmitting the signals. One example of a non-transitory storage device includes a read-only memory (ROM), which can store signals and/or states representative of the software portions for a period of time. However, the ability to store the signals and/or states is not diminished by further functionality of transmitting signals that are the same as or representative of the stored signals and/or states. For example, a processor may access the ROM to obtain signals that are representative of the stored signals and/or states in order to execute the corresponding software instructions.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A computer-implemented method for analyzing energy storage device information, comprising:
    a feature extraction module configured for:
        receiving input data including passive information collected from passive measurements of a battery and active information collected from active measurements of a response of the battery to a stimulus signal applied to the battery;
        performing geometric-based parameter identification responsive to the input data relative to an electrical equivalent circuit model to develop geometric parameters;
        performing optimization-based parameter identification responsive to the input data relative to the electrical equivalent circuit model to develop optimized parameters; and
        performing a decision fusion algorithm for combining the geometric parameters and the optimized parameters to develop new internal battery parameters including at least a constant phase element exponent, electrolyte resistance, and charge transfer resistance;
    a state estimation module for updating an internal state model of the battery responsive to the new internal battery parameters;
    a health estimation module for processing the internal state model to determine a present battery health including one or both of a state-of-health (SOH) estimation and a state-of-charge (SOC) estimation for the battery; and
    a communication module for communicating one or more of the SOH estimation and the SOC estimation to a user, a related computing system, or a combination thereof.

2. The computer-implemented method of claim 1, wherein performing the geometric-based parameter identification further comprises deriving the constant phase element exponent, the electrolyte resistance, and the charge transfer resistance from a Nyquist plot representation of electrochemical impedance spectroscopy data collected from the active measurements.

3. The computer-implemented method of claim 1, wherein performing the optimization-based parameter identification further comprises deriving the constant phase element exponent, the electrolyte resistance, and the charge transfer resistance from electrochemical impedance spectroscopy data collected from the active measurements and performing a nonlinear optimization of each parameter estimated by minimizing a selected objective function.

4. The computer-implemented method of claim 1, wherein performing the decision fusion algorithm further comprises combining the geometric parameters and the optimized parameters with a weighted average.

5. The computer-implemented method of claim 1, further comprising:
    a health prediction module for processing the internal state model to determine a battery health prediction including one or both of a remaining-useful-life (RUL) prediction and an end-of-life (EOL) prediction for the battery; and
    wherein the communication module is further configured for communicating one or more of the RUL prediction and the EOL prediction, to the user, the related computing system, or a combination thereof.

6. A computer-implemented method for analyzing battery information, comprising:

receiving input data including passive information collected from passive measurements of a battery and active information collected from active measurements of a response of the battery to a stimulus signal applied to the battery;

performing a feature extraction process using the input data to develop geometric parameters responsive to an analysis of the input data relative to an electrical equivalent circuit model, develop optimized parameters responsive to another analysis of the input data relative to the electrical equivalent circuit model, and combining the geometric parameters and the optimized parameters to develop internal battery parameters including at least a constant phase element exponent, electrolyte resistance, and charge transfer resistance;

performing two or more analysis processes using the internal battery parameters to develop two or more health metrics corresponding to each analysis process, wherein the health metrics from the analysis processes are selected from capacity, available power, or pulse resistance;

determining a state-of-health (SOH) estimation for the battery by performing a decision fusion algorithm for combining the two or more health metrics from the two or more analysis processes; and communicating the SOH estimation to a user, a related computing system, or a combination thereof.

7. The computer-implemented method of claim 6, wherein:

one analysis process of the two or more analysis processes comprises using the internal battery parameters in a particle filter (PF) analysis to develop a PF capacity metric, a neural network (NN) analysis to develop an NN capacity metric, and an auto regressive moving average (ARMA) analysis to develop an ARMA capacity metric; and further comprising performing a capacity decision fusion algorithm for combining the PF capacity metric, the NN capacity metric, and the ARMA capacity metric to develop an overall capacity health metric for inclusion in the decision fusion algorithm as one of the two or more health metrics.

8. The computer-implemented method of claim 6, wherein:

one analysis process of the two or more analysis processes comprises using the internal battery parameters in a particle filter (PF) analysis to develop a PF available power metric, a neural network (NN) analysis to develop an NN available power metric, and an auto regressive moving average (ARMA) analysis to develop an ARMA available power metric; and further comprising performing an available power decision fusion algorithm for combining the PF available power metric, the NN available power metric, and the ARMA available power metric to develop an overall available power health metric for inclusion in the decision fusion algorithm as one of the two or more health metrics.

9. The computer-implemented method of claim 6, wherein:

one analysis process of the two or more analysis processes comprises using the internal battery parameters in a particle filter (PF) analysis to develop a PF pulse resistance metric, a neural network (NN) analysis to develop an NN pulse resistance metric, and an auto regressive moving average (ARMA) analysis to develop an ARMA pulse resistance metric; and further comprising performing a pulse resistance decision fusion algorithm for combining the PF pulse resistance metric, the NN pulse resistance metric, and the ARMA pulse resistance metric to develop an overall pulse resistance health metric for inclusion in the decision fusion algorithm as one of the two or more health metrics.

10. The computer-implemented method of claim 6, wherein:

performing the two or more analysis processes comprises:
performing a capacity analysis to develop an overall capacity health metric;
performing an available power analysis to develop an overall available power health metric; and
performing a pulse resistance analysis to develop an overall pulse resistance health metric; and performing the decision fusion algorithm comprises using a weighted average to combine the overall capacity health metric, the overall available power health metric, and the overall pulse resistance health metric to determine the SOH estimation.

11. The computer-implemented method of claim 6, further comprising:

performing a remaining-useful-life (RUL) analysis responsive to the SOH estimation to develop an RUL prediction; and communicating the RUL prediction to the user, the related computing system, or a combination thereof.

12. The computer-implemented method of claim 11, further comprising:

performing an end-of-life (EOL) analysis responsive to the SOH estimation and the RUL prediction to develop an EOL prediction; and communicating the EOL prediction to a user, a related computing system, or a combination thereof.

13. A computer-implemented method for analyzing battery information, comprising:

receiving input data including passive information collected from passive measurements of a battery and active information collected from active measurements of a response of the battery to a stimulus signal applied to the battery;

performing a feature extraction process using the input data to develop internal battery parameters including at least a constant phase element exponent, electrolyte resistance, and charge transfer resistance;

performing two or more analysis processes using the internal battery parameters to develop two or more state-of-charge (SOC) estimates corresponding to each analysis process, wherein:
a first analysis processes comprises a particle filter analysis for estimating battery internal states responsive to the internal battery parameters followed by a first neural network analysis for developing a first SOC estimate from the battery internal states; and
additional analysis processes are selected from a second neural network (NN) analysis and an auto regressive moving average (ARMA) analysis;

determining an SOC estimation for the battery by performing a decision fusion algorithm for combining the two or more SOC estimates from the two or more analysis processes; and communicating the SOC estimation to a user, a related computing system, or a combination thereof.

14. The computer-implemented method of claim 13, wherein:

performing the two or more analysis processes comprises:
  performing the second NN analysis to develop an NN SOC estimate;
  performing the ARMA analysis to develop an ARMA SOC estimate; and
  performing the first analysis processes to develop an NN-PF combined SOC estimate; and
performing the decision fusion algorithm comprises using a weighted average to combine the NN SOC estimate, the ARMA SOC estimate, and the NN-PF combined SOC estimate to determine the SOC estimation.

15. A computer-implemented method for analyzing battery information, comprising:
  receiving input data including passive information collected from passive measurements of a battery and active information collected from active measurements of a response of the battery to a stimulus signal applied to the battery;
  performing a feature extraction process using the input data to develop geometric parameters responsive to an analysis of the input data relative to an electrical equivalent circuit model, develop optimized parameters responsive to another analysis of the input data relative to the electrical equivalent circuit model, and combining the geometric parameters and the optimized parameters to develop internal battery parameters including at least a constant phase element exponent, electrolyte resistance, and charge transfer resistance;
  performing two or more analysis processes using the internal battery parameters to develop two or more Remaining-useful-life (RUL) estimates corresponding to each analysis process and two or more End-of-life (EOL) estimates corresponding to each analysis process, wherein the analysis processes are selected from a particle filter (PF) analysis, a neural network (NN) analysis, and an auto regressive moving average (ARMA) analysis;
  determining an RUL prediction for the battery by performing a decision fusion algorithm to combine the two or more RUL estimates from the two or more analysis processes, determining an EOL prediction for the battery by performing the decision fusion algorithm to combine the two or more EOL estimates from the two or more analysis processes; and
  communicating at least one of the RUL prediction and the EOL prediction to a user, a related computing system, or a combination thereof.

16. The computer-implemented method of claim 15, wherein:
  performing the two or more analysis processes comprises:
    performing the PF analysis to develop a PF RUL estimate;
    performing the NN analysis to develop an NN RUL estimate; and
    performing the ARMA analysis to develop an ARMA RUL estimate; and
  performing the decision fusion algorithm comprises using a weighted average to combine the PF RUL estimate, the NN RUL estimate, and the ARMA RUL estimate to determine the RUL prediction.

17. The computer-implemented method of claim 15, wherein:
  performing the two or more analysis processes comprises:
    performing the PF analysis to develop a PF EOL estimate;
    performing the NN analysis to develop an NN EOL estimate; and
    performing the ARMA analysis to develop an ARMA EOL estimate; and
  performing the decision fusion algorithm comprises using a weighted average to combine the PF EOL estimate, the NN EOL estimate, and the ARMA EOL estimate to determine the EOL prediction.

18. A battery condition monitoring system, comprising:
  one or more active data acquisition units configured for applying a signal to a battery and measuring a response of the battery to the applied signal as active information; and
  processing circuitry configured for:
    performing geometric-based parameter identification responsive to the active information relative to an electrical equivalent circuit model to develop geometric parameters;
    performing optimization-based parameter identification responsive to the active information relative to the electrical equivalent circuit model to develop optimized parameters;
    performing a decision fusion algorithm for combining the geometric parameters and the optimized parameters to develop new internal battery parameters including at least a constant phase element exponent, electrolyte resistance, and charge transfer resistance;
    updating an internal state model of the battery responsive to the new internal battery parameters;
    processing the internal state model to determine a battery health prediction including one or both of a remaining-useful-life (RUL) prediction and an end-of-life (EOL) prediction for the battery; and
    communicating one or more of the RUL prediction, the EOL prediction, to a user, a related computing system, or a combination thereof.

19. The battery condition monitoring system of claim 18, wherein the processing circuitry is further configured for:
  a health estimation module for processing the internal state model to determine a present battery health including one or both of a state-of-health (SOH) estimation and a state-of-charge (SOC) estimation for the battery; and
  communicating one or more of the SOH estimation and the SOC estimation to the user, the related computing system, or a combination thereof.

20. The battery condition monitoring system of claim 18, further comprising:
  one or more passive data acquisition units configured for collecting passive information about the battery, the passive information selected from the group consisting of a temperature of the battery, voltage of the battery, and current of the battery; and
  wherein the processing circuitry is further configured for modifying the internal state model responsive to the passive information.

* * * * *

UNITED STATES PATENT AND TRADEMARK OFFICE
CERTIFICATE OF CORRECTION

PATENT NO. : 10,209,314 B2
APPLICATION NO. : 15/357322
DATED : February 19, 2019
INVENTOR(S) : Humberto E. Garcia and Jon P. Christophersen Page 1 of 1

It is certified that error appears in the above-identified patent and that said Letters Patent is hereby corrected as shown below:

In the Specification
Column 14, Line 60, change "estimated, $I_w$," to --estimated, $I_{wi}$--
Column 15, Line 4, change "(TAB). Assuming" to --(IAE). Assuming--
Column 17, Line 52, change "the $SOH_1[k]$ based" to --the $SOH_i[k]$ based--
Column 19, Line 29, change "each SOC, estimation" to --each SOC estimation--

Signed and Sealed this
Ninth Day of April, 2019

Andrei Iancu
*Director of the United States Patent and Trademark Office*